(12) United States Patent
Maier et al.

(10) Patent No.: US 11,189,455 B2
(45) Date of Patent: Nov. 30, 2021

(54) CRYOGENIC ULTRA-HIGH VACUUM SUITCASE

(71) Applicant: FERROVAC AG, Zurich (CH)

(72) Inventors: Urs Maier, Zurich (CH); David Von Gunten, Zurich (CH)

(73) Assignee: FERROVAC AG, Zurich (CH)

( * ) Notice: Subject to any disclaimer, the term of this patent is extended or adjusted under 35 U.S.C. 154(b) by 0 days.

(21) Appl. No.: 17/287,173

(22) PCT Filed: Feb. 6, 2019

(86) PCT No.: PCT/EP2019/052933
§ 371 (c)(1),
(2) Date: Apr. 21, 2021

(87) PCT Pub. No.: WO2020/119956
PCT Pub. Date: Jun. 18, 2020

(65) Prior Publication Data
US 2021/0313139 A1 Oct. 7, 2021

(30) Foreign Application Priority Data
Dec. 11, 2018 (WO) .................. PCT/EP2018/084390

(51) Int. Cl.
*H01J 37/20* (2006.01)
*H01J 37/26* (2006.01)

(52) U.S. Cl.
CPC ............... *H01J 37/20* (2013.01); *H01J 37/26* (2013.01); *H01J 2237/2001* (2013.01)

(58) Field of Classification Search
CPC ..... H01J 37/20; H01J 37/26; H01J 2237/2001
See application file for complete search history.

(56) References Cited

U.S. PATENT DOCUMENTS

2012/0293791 A1* 11/2012 Milas .................... H01J 37/226
356/72
2019/0371567 A1* 12/2019 Ideno .................. H01J 37/3174

FOREIGN PATENT DOCUMENTS

JP        H06290728 A        10/1994

OTHER PUBLICATIONS

International Search Report & Written Opinion in PCT/EP2019/052933 dated Dec. 3, 2019, 16 pages.
(Continued)

*Primary Examiner* — Jamel E Williams
(74) *Attorney, Agent, or Firm* — Pearne & Gordon LLP

(57) ABSTRACT

The present invention relates to a transportable device, for the transport and transfer of a sample under ultra-high vacuum conditions and at low temperature, comprising a vacuum chamber, a cooling system, a transfer rod by means of which the sample positon can be adjusted, a valve by means of which the chamber can be opened or closed and attached to another vacuum apparatus, a pump designed to maintain in the chamber a pressure below $10^{-9}$ mbar all the time a sample is inside the chamber and/or all the time the sample is being transferred, a cooling shield defining a volume inside the chamber in which the sample is kept during transport, wherein the cooling shield (106) is thermally contacted to the cooling system, a sample holder removably attached to the transfer rod and configured to carry the sample during transport, a cooling block thermally contacted to the cooling shield, wherein the cooling block and the sample holder are configured such that they can be brought in thermal contact inside the volume defined by the cooling shield, wherein the cooling system is configured to be able cool the cooling shield to a temperature below 80 K. and wherein the thermal contacts between the cooling shield and the cooling block and/or between the cooling block and the sample holder are configured such that the sample is kept (Continued)

at a temperature higher than the cooling shield all the time the temperature of the cooling shield is lower titan the temperature of the chamber. The present invention relates also to the use of a hexapod port aligner for the transfer of a sample front a vacuum transport device to an electron microscope, especially a transmission electron microscope.

22 Claims, 20 Drawing Sheets

(56) References Cited

OTHER PUBLICATIONS

Tacke, et al. "A Versatile High-Vacuum Cryo-transfer System for Cryo-microscopy and Analytics." Biophysical Journal. vol. 110. Feb. 2016. pp. 758-764.

Ulfig, et al. "Applications, Technical Challenges, and Recent Implementation of a UHV/Cryogenic Specimen Transfer System for Atom Probe Tomography" Microsc. Microanalysis vol. 23. Suppl. 1. 2017. 2 pages.

Leica EM VCT100. Vacuum Cryo Transfer—From Preparation to Analysis. Leica Microsystems. 2009. 12 pages.

* cited by examiner

CRYOGENIC ULTRA-HIGH VACUUM SUITCASE

TECHNICAL FIELD OF THE INVENTION

The present invention relates to the technical field of vacuum devices, more specifically to the technical field of transportable vacuum devices. In particular, the present invention relates to a transportable vacuum device, in the following called a vacuum suitcase, which allows for transporting and transferring samples from one vacuum chamber to another distanced vacuum chamber under so-called ultra-high vacuum (UHV) conditions. More precisely, the present invention relates to a device by means of which a sample can be transported under UHV conditions while kept at cryogenic temperature. Moreover, the present invention relates also to the use of a hexapod port aligner for the transfer of a sample transported under vacuum conditions by means of a vacuum suitcase to an electron microscope.

BACKGROUND OF THE INVENTION

In many fields of experimental science, samples are prepared under very specific and controlled atmospheric conditions. These samples are particularly valuable not mainly in terms of how much they do really cost but more in terms of the hours of preparation that they require. Unfortunately, in the vast majority of cases these samples would deteriorate immediately if exposed to normal atmospheric conditions. It is therefore essential to provide a means for the transport and transfer of samples from the apparatus or device in which they were prepared under specific conditions to the apparatus in which they will be analysed. It is actually very common that the preparation device and the analysis chamber are separate and distant. These chambers can be in different laboratories on the same campus or in different countries or even on different continents.

The problem of the transport of very sensitive samples is not new and triggered the development of so-called vacuum suitcases for the transfer of samples between preparation and analysis chambers while keeping the samples under vacuum conditions at all time.

While the vast majority of existing suitcases allows for transporting samples under high vacuum conditions, i.e. in a pressure range of $10^{-6}$ to $10^{-7}$ mbar, it is not possible with these devices to transport samples under so-called ultra-high vacuum (UHV) conditions, i.e. at a pressure below $10^{-9}$ mbar. However, this pressure regime is by far the most interesting one in modern science, especially in modern surface physics and nano-science. Samples transported under high vacuum conditions deteriorate already in minutes, making impossible their characterization or their use.

Ultra-high vacuum is one essential condition under which sensitive samples shall be transported from a preparation chamber to another or between several characterization chambers. Another critical parameter is the sample temperature. It is very common that samples are prepared at cryogenic temperatures. This is for instance often the case in the field of surface physics. If samples prepared at cryogenic temperatures are allowed to heat up, they again almost immediately deteriorate. Samples needs therefore to be transported between the preparation chamber and the analysis chamber while keeping them at low temperature.

A further problem when transporting and transferring samples under ultra-high vacuum conditions and at cryogenic temperature is given by the transfer step of a sample from the vacuum suitcase to the recipient chamber itself. Indeed in order to be able to keep the sample at cryogenic temperature and under the best possible vacuum conditions, all components of the vacuum suitcase but also of the recipient chamber are optimized, usually very small and delicate. Therefore in order to be able to transfer samples from a cryogenic UHV suitcase, as proposed in the present invention, to an analysis chamber, as an electron microscope, the axes of both devices must be aligned as good as possible. Otherwise the transfer can cause significant damages in these devices.

It is why the inventors of the present application have developed a cryogenic ultra-high vacuum suitcase, that allows for transporting and transferring samples under ultra-high vacuum conditions while keeping the samples at cryogenic temperature. The inventors propose also a means for allowing a smooth and risk-free transfer of samples from a vacuum suitcase to an analysis chamber as for instance an electron microscope.

SUMMARY OF THE INVENTION

Thus, the objects of the present invention are to propose a transportable device for the transport and transfer of samples under ultra-high vacuum conditions and at low temperature and to propose the use of a port-aligner for the transfer of samples from a vacuum suitcase to an analysis chamber.

According to the present invention, these objects are achieved in particular through the elements of the independent claims. Further advantageous embodiments follow moreover from the dependent claims and the description. Features disclosed herein in different embodiments can also be combined easily by a person who is skilled in the art.

In particular, in a first aspect, the objects of the present invention are achieved by a transportable device, for the transport and transfer of a sample under ultra-high vacuum conditions and at low temperature, comprising a vacuum chamber, a cooling system, a transfer rod by means of which the sample positon can be adjusted, a valve by means of which the chamber can be opened or closed and attached to another vacuum apparatus, a pump designed to maintain in the chamber a pressure below $10^{-9}$ mbar all the time a sample is inside the chamber and/or all the time the sample is being transferred, a cooling shield defining a volume inside the chamber in which the sample is kept during transport, wherein the cooling shield is thermally contacted to the cooling system, a sample holder removably attached to the transfer rod and configured to carry the sample at least during transport, a cooling block thermally contacted to the cooling shield, wherein the cooling block and the sample holder are configured such that they can be brought in thermal contact inside the volume defined by the cooling shield, wherein the cooling system is configured to be able to cool the cooling shield to a temperature below 80K, and wherein the thermal contacts between the cooling shield and the cooling block and/or between the cooling block and the sample holder are configured such that the sample is kept at a temperature higher than the cooling shield all the time the temperature of the cooling shield is lower than the temperature of the chamber.

Thanks to the device according to the present invention, it is possible to transport a sample at UHV conditions and at low temperature while ensuring that the sample is not the coldest spot in the vacuum chamber. With a cooling shield colder than the sample, it is ensured that the sample does not act as a cryogenic pump. It is therefore possible to transport a sample kept at low temperature by means of the inventive device and to guarantee that the sample stays uncontaminated. With the transfer rod it is possible to transfer the sample holder and/or the sample to analysis or preparation chamber for measurement or further processing respectively.

In a preferred embodiment of the present invention, the thermal contacts between the cooling shield and the cooling block and/or between the cooling block and the sample holder are configured such that the temperature difference between cooling shield and sample is at least 10K, preferably 15K, even more advantageously 20K. By this means, it is possible to have a sample kept at very low temperature while ensuring that it stays uncontaminated.

In another preferred embodiment of the present invention, the device comprises at least one cooling shield temperature sensor for measuring the temperature of the cooling shield. With this it is possible to monitor the temperature of the cooling shield. It is for instance useful to know if the temperature of the cooling shield is sufficiently low, that a sample kept at low temperature in a preparation apparatus can be transferred to the transport device without having the risk that the temperature of the sample raises above an unacceptable temperature threshold that would damage the sample.

In a further preferred embodiment of the present invention, the device comprises a sample holder temperature sensor for measuring the temperature of the sample holder. By this means the temperature of the sample can be monitored and it can be guaranteed that the sample is kept all the time at a sufficiently low temperature.

In another preferred embodiment of the present invention, the device comprises a heater by means of which the temperature difference between sample and cooling shield is adjustable. With this it is possible to precisely adjust the temperature of the sample. This can be very advantageous when a vitrified sample is transported by the device. By rising the temperature in a controlled manner, the bulk water, respectively ice, of the sample can be sublimated while keeping the hydration shell of proteins.

In another preferred embodiment of the present invention, the pump is a non-evaporable getter ion combination pump. With a non-evaporable getter ion combination pump, it is possible to reach and maintain UHV conditions with a very small pump volume. The device according to this embodiment is therefore lighter and easier to transport. Furthermore, since at UHV conditions the active part of a non-evaporable getter ion combination pump is the non-evaporable getter and since this part of the pump does need any power source, UHV conditions can be kept inside the chamber of the device according to the present invention during months or even years.

In a further preferred embodiment of the present invention, the device comprises a pump controller for supplying high voltage to the pump. By integrating the controller of the pump to the device, it is possible to ensure that the lowest possible vacuum conditions are maintained during transport.

In a further preferred embodiment of the present invention, the pressure inside the chamber is measurable by means of the pump. With this the pressure inside the chamber can be monitored without the need to add a pressure gauge to the device. In particular the pressure inside the chamber can be measured by means of the ion current measured by the ion pump element of the pump.

In another preferred embodiment of the present invention, the cooling system is a cryogenic fluid Dewar. By pouring a cryogenic fluid in the Dewar it is possible to rapidly cool down the cooling shield without requiring a power source which would be required in case of a mechanically active cooler.

In a further preferred embodiment of the present invention, the cryogenic fluid is liquid nitrogen. With liquid nitrogen it possible to keep the sample at a temperature below 100K in a convenient and known manner.

In a further preferred embodiment of the present invention, the device comprises a parking stage linear feedthrough, whose air-side portion is positioned inside a Dewar attached to the vacuum chamber, and whose vacuum-side portion is connected to a parking stage, wherein it further comprises a parking stage cooling block thermally connected to the Dewar and configured such that the parking stage can be cooled down by pressing it against the parking stage cooling block and wherein the parking stage can be translated inside the cooling shield by means of the parking stage linear feedthrough. With this, it is possible to have a sample parking stage that can be cooled down to cryogenic temperature. By means of the suitcase according to this embodiment, it is therefore possible to transport at the same time several samples all kept at cryogenic temperature.

In another preferred embodiment of the present invention, the cooling system is a mechanical cooler. Thanks to a mechanical cooler it is possible to cool down the sample rapidly without the risk associated with the use of a cryogenic fluid. It is therefore possible to transport a sample kept at low temperatures with transport means in which the use of a cryogenic fluid is not allowed, for instance by plane.

In a further preferred embodiment of the present invention, the mechanical cooler is a Stirling cooler or a Gifford-McMahon cooler. These two types of mechanical coolers have the advantage that they require little volume which means that the transport device can be conveniently transported. Furthermore, they require little energy.

In a further preferred embodiment of the present invention, the device comprises control electronic means for electrical powering and control of the mechanical cooler. By integrating the control electron means of the mechanical cooler to the transport device, it is possible to transport a sample kept at low temperature over very long distance.

In another preferred embodiment of the present invention, the control electronic means is operatable by means of a battery or by means of a 24V power source. With this is possible to take advantage of the usual 24V power source of a car to operate the mechanical cooler or to operate the latter without a connection to any external power source. This allows for the transport over long distance without the need of an external power source. This allows also the monitoring of the vacuum level all the time during transport.

In another preferred embodiment of the present invention, the cooling shield comprises at least one opening and the chamber at least one vacuum window, wherein the opening and the vacuum window are arranged such that the sample is optically observable from outside the chamber while it is kept inside the volume defined by the cooling shield. With this, optical measurements, for instance optical spectroscopy, can be performed on the sample while the latter is inside the volume defined by the cooling shield.

In a further preferred embodiment of the present invention, the sample is optically observable while the sample holder and the cooling block are in thermal contact. With this optical measurement, for instance optical spectroscopy can be performed on the sample while the latter is kept at low temperature.

In a further preferred embodiment of the present invention, the at least one opening of the cooling shield is covered by an optically transparent and heat reflective material. By this mean, it is possible to perform optical measurements of the sample while ensuring that no heat radiation of the hot walls of the vacuum chamber or from the outside can attain the sample and heat it up.

In another preferred embodiment of the present invention, the device comprises a sample shield located inside the cooling shield and surrounding sample, wherein the sample shield is displaceable with respect to the cooling shield and wherein the position of sample with respect to the sample shield can be adjusted for its transfer. With this it is possible to transfer the sample while the sample is surrounded by the cooled surfaces of the sample shield at all time. It is therefore possible to keep the sample at cryogenic temperature at all time even if the thermal contact with the cooling block is interrupted and the sample is not actively cooled down. This is advantageous in situations where the transfer step itself requires a long time.

In another preferred embodiment of the present invention, the device comprises a parking stage thermally contacted to the cooling shield on which at least one sample can be positioned. With this it is possible to transport more than one sample at the same time, with all the samples are kept at low temperature.

In another preferred embodiment of the present invention, the device comprises a parking heater by means of which the temperature of the parking stage is adjustable. With this it is possible to adjust the temperature of the sample kept on the parking stage.

In a further preferred embodiment of the present invention, the transfer rod comprises a transfer head for grabbing and releasing the sample holder. By this means it is possible to transfer a sample holder with a sample onto a sample holder stage in another apparatus or onto a parking stage of the vacuum suitcase.

In a further preferred embodiment of the present invention, the transfer head is made out of a thermoplastic such as polyether ether ketone or a polyamide-imide. With this it is ensured that no heat from the transfer rod is transferred to the sample holder.

In a further preferred embodiment of the present invention, the cooling shield and/or the cooling block are made out of AlMgSi1. This material has particular high thermal conductivity while being easily workable and highly vacuum compatible.

In another preferred embodiment of the present invention, the device is configured such that the sample is transferable to an electron microscope, especially a transmission electron microscope. Thanks to a device according to this embodiment, samples can be transferred to an electron microscope for imaging by means of electron microscopy. It is particularly advantageous when the sample comprises biomolecules, for instance proteins that need to be imaged by means of transmission electron microscopy.

In another preferred embodiment of the present invention, the device comprises a port aligner attached to the air-side of the valve. A port aligner is advantageous when the transfer rod and/or the stage onto which the sample shall be transferred do not comprise means for adjusting their position. With the port aligner, it can be ensured that no damage due to misalignment is produced upon transfer of the sample.

In a further preferred embodiment of the present invention, the port aligner is a hexapod port aligner. With a hexapod port aligner, the axis of the transfer rod and of the recipient stage onto which the sample shall be transferred can very precisely be aligned in all directions.

In a further preferred embodiment of the present invention, the device is configured to be bakeable to at least 350K, advantageously at least 450K. With this it possible to rapidly attain UHV conditions inside the chamber of the device, for instance by means of a turbomolecular pump attached to the valve of the device.

In another preferred embodiment of the present invention, the device comprises a buffer volume removably attached to the valve. Thanks to the buffer volume, the side of the valve opposite to the chamber can be kept at a pressure lower than atmospheric pressure. With this UHV conditions can be kept for longer time inside the chamber.

In another preferred embodiment of the present invention, the vacuum chamber is made out of an aluminium alloy. This allows for reducing the weight of the device.

In a further preferred embodiment of the present invention, the inner surfaces of the vacuum chamber are electropolished. This permits to attain a better vacuum inside the vacuum chamber and allows for attaining the lowest possible temperature inside the vacuum chamber In a further preferred embodiment of the present invention, the inner surfaces of the vacuum chamber are coated with Aluminium, Gold or Silver. This is advantageous for attaining the lowest possible temperature inside the vacuum chamber.

In a further preferred embodiment of the present invention, the vacuum chamber is made out of a monolithic block. This allows for a simple manufacturing and permits to avoid welded joints that can be the source of vacuum leakage.

In a further preferred embodiment of the present invention, the geometry of the vacuum chamber is configured such that the pumping capacity of the pump is optimized. This is important for reaching the lowest possible vacuum level with the pump at hand. In the case of a non-evaporable getter ion combination pump, it is particularly favourable if the geometry of the chamber is chosen such that the non-evaporable element of the pump is located completely freestanding as close as possible to the centre of the chamber.

The goals of the present invention are also attained by the use of a hexapod port aligner for the transfer of a sample from a vacuum transport device to an electron microscope, especially a transmission electron microscope. By employing a hexapod port aligner the samples stored in a vacuum transport device can be easily transferred to an electron microscope. During such a transfer it is very important that the axis of the transfer device, for instance a linear transfer rod, of the vacuum transport device, matches the axis of the recipient sample stage in the electron microscope. With a hexapod port aligner, these axes can be optimally aligned in all directions.

In a preferred embodiment, a hexapod port aligner is used when the sample is kept in the vacuum transport device at a temperature below 150 K, especially below 100 K. The alignment of the axes of the transfer device of the vacuum transport device and of the recipient stage in the electron microscope is of particular importance when the sample to be transferred is kept at cryogenic temperatures.

In a preferred embodiment, the hexapod port aligner is used as buffer volume between the vacuum transport device and the electron microscope. With this it is not necessary to foresee a separate element acting as buffer volume.

In a further preferred embodiment, the vacuum transport device is a transport device according to the present invention. This allows for optimal transport and transfer of a sample kept at cryogenic temperature and at UHV conditions to an electron microscope.

BRIEF DESCRIPTION OF THE DRAWINGS

Other features and advantages of the invention will become apparent from the following description of non-limiting exemplary embodiments with reference to the appended drawings, in which.

DETAILED DESCRIPTION OF THE PREFERRED EMBODIMENTS OF THE INVENTION

Figure 1:
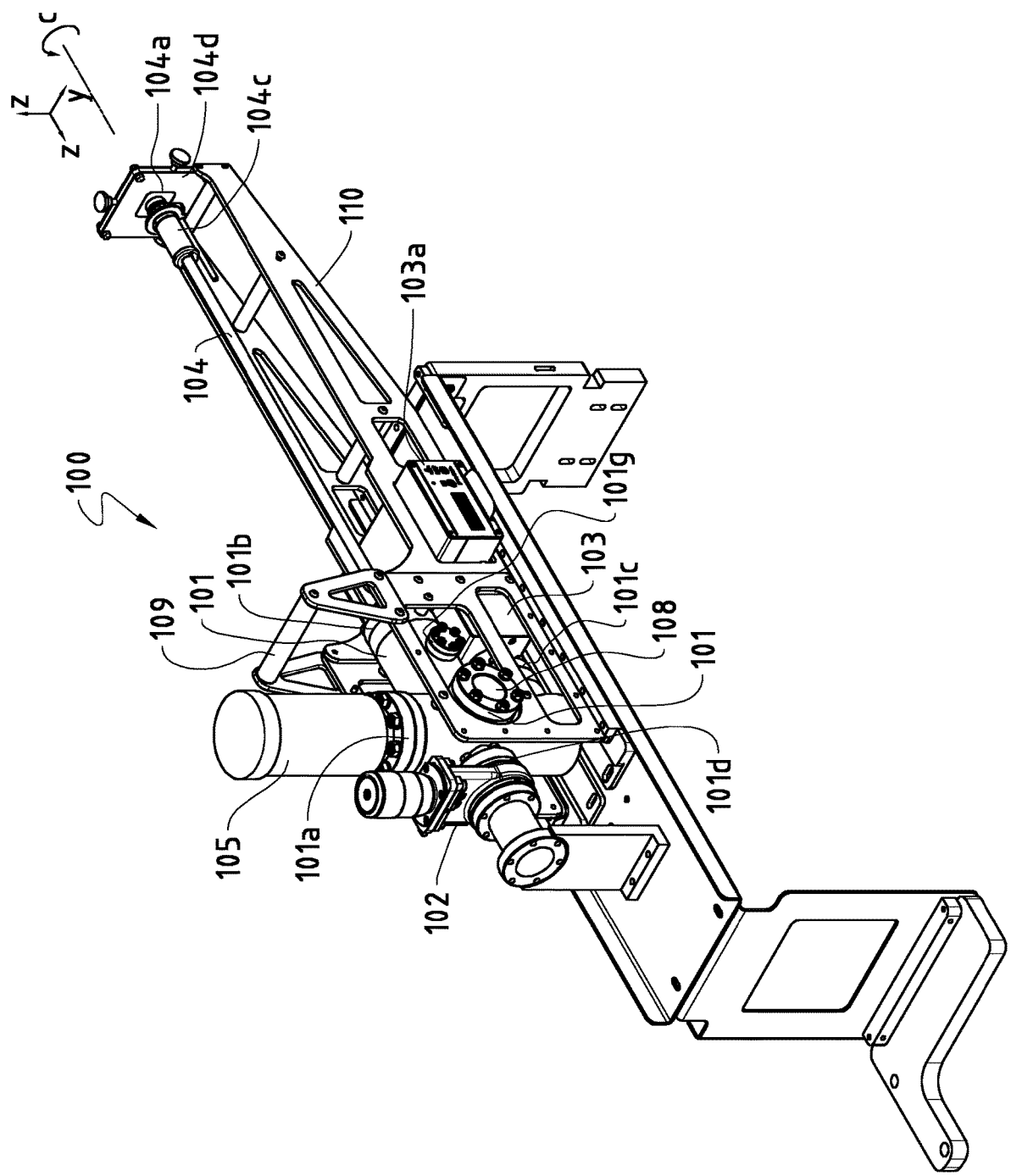
FIG. 1 is a schematic perspective view of a device according to a first embodiment of the present invention.

FIG. 1 shows a perspective view of a first preferred embodiment of a cryogenic UHV suitcase 100 according to the present invention. The UHV vacuum suitcase 100 comprises a vacuum chamber 101, advantageously made out of stainless steel of type 316 or even more advantageously of stainless steel of type 316L. The chamber 101 comprises eight CF flanges 101a-101h. Attached to the flange 101d is a gate valve 102 which permits to isolate the chamber 101 from the surrounding. It allows for example for detaching the UHV suitcase 100 from a preparation or analysis chamber (not shown here) from which or to which a sample shall be transferred while keeping UHV vacuum conditions inside the chamber 101. A so-called non-evaporable getter ion combination pump 103, which is a combination of a non-evaporable getter element and an ion pump, is mounted on the flange 101c of the chamber 101. The combination pump 103 permits on the one hand to attain and maintain UHV vacuum conditions inside the chamber 101, i.e. pressure below $10^{-9}$ mbar, and on the other hand to monitor the vacuum level. By converting the ion current measured by means of the ion pump part of the pump 103 into a pressure unit it is possible to easily monitor the pressure in the vacuum suitcase at any time. Since at UHV conditions the predominantly active part of the non-evaporable getter ion combination pump is the non-evaporable getter part and since the non-evaporable getter part does not require any power source, UHV conditions can be maintained in the chamber 101 for months or even years without requiring any power source.

Figure 2:
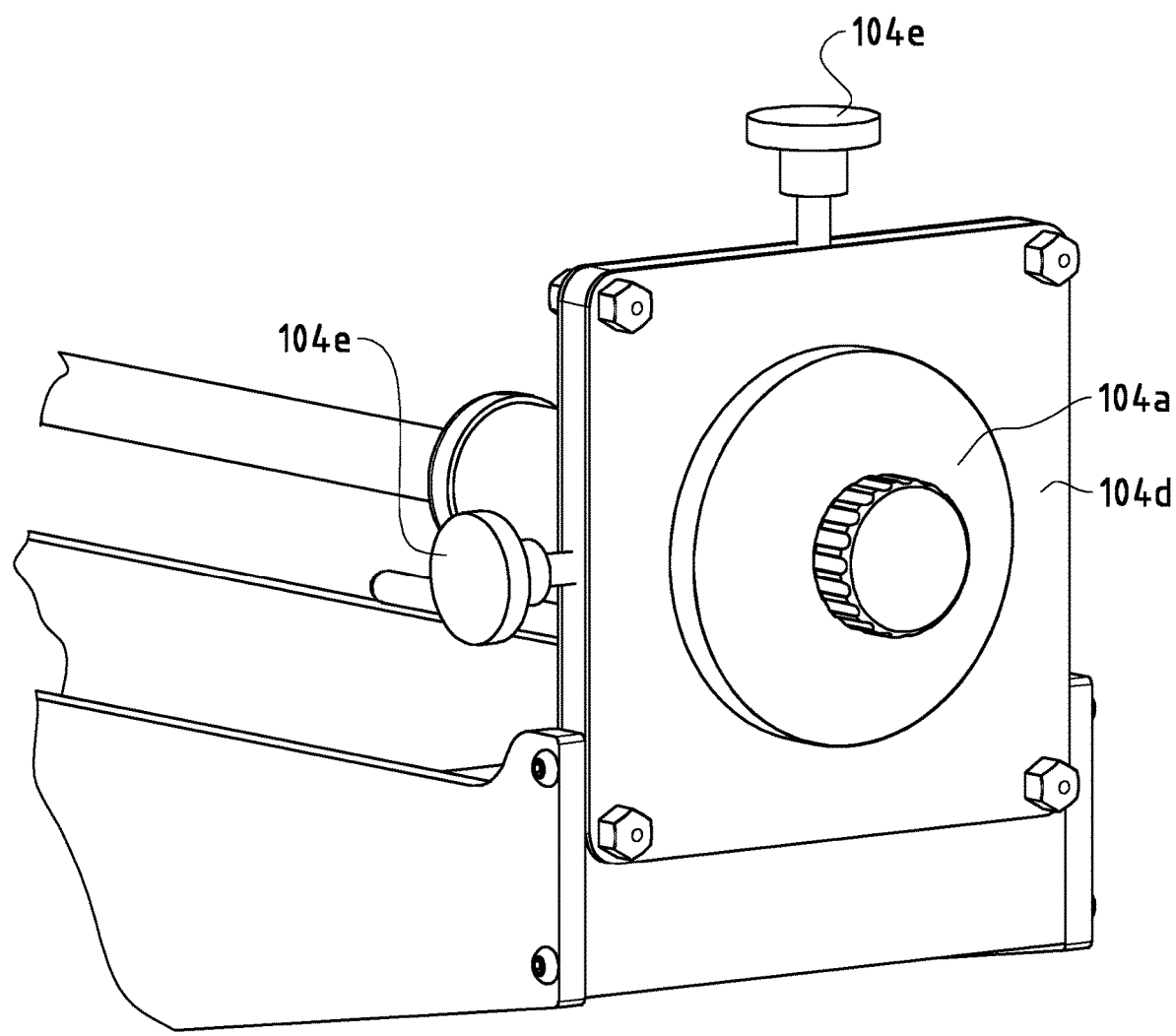
FIG. 2 is a schematic perspective view of an alignment device for the sample transfer manipulation axis of the device according to a first embodiment of the present invention.

A transfer rod 104, in this preferred embodiment a so-called wobble-stick, is mounted on the flange 101b of the chamber 101. This transfer rod 104 allows for manipulating the sample (cf. below for more details). The movement range of the wobble-stick is purposely limited by the transfer rod plate 104a in order to avoid unintentionally damaging of a component inside the vacuum chamber 101. As can be seen in FIG. 2, the transfer rod 104, more precisely the plate 104a, is supported by an alignment device 104d. The orientation of the transfer rod axis can be precisely adjusted via the screws 104e of the alignment device 104d. The possibility of a fine and precise alignment of the transfer rod axis is particularly advantageous in situations where a cold sample must be transferred to a cold stage inside a preparation or analysis chamber where the receipting stage inside this chamber is either very delicate or has a limited acceptance angle.

A manipulation head 104b (cf. below for more details) is attached to the wobble-stick 104. The manipulation head 104b allows for manipulating a sample 1 inside the chamber 101. The wobble-stick 104 allows for movements of the sample in any direction X, Y or Z as well as rotation of the sample around the axis C by means of the manipulation handle 104c. The manipulation handle 104c can be blocked in order to avoid unintentional movement of the manipulation head 104b.

A cooling system 105, here a liquid nitrogen (LN2) Dewar, is attached to the flange 101a of the chamber 101. Now with respects to FIG. 3, which is a view of the inside of the chamber 101, it becomes apparent that the Dewar 105 is thermally contacted inside the chamber 101 to a cooling shield 106 comprising a first part 106a and a second part 106b. By filling the Dewar 105 with LN2, the cooling shield 106 can rapidly be cooled down to 77K. Advantageously, the cooling shield 106 is made out of a material with a high thermal conductivity, for instance AlMgSi1. Alternatively, the cooling shield can be made out of pure polished Aluminium or Copper. Advantageously, both materials can be covered by a thin layer of Gold and/or Silver.

Figure 4A:
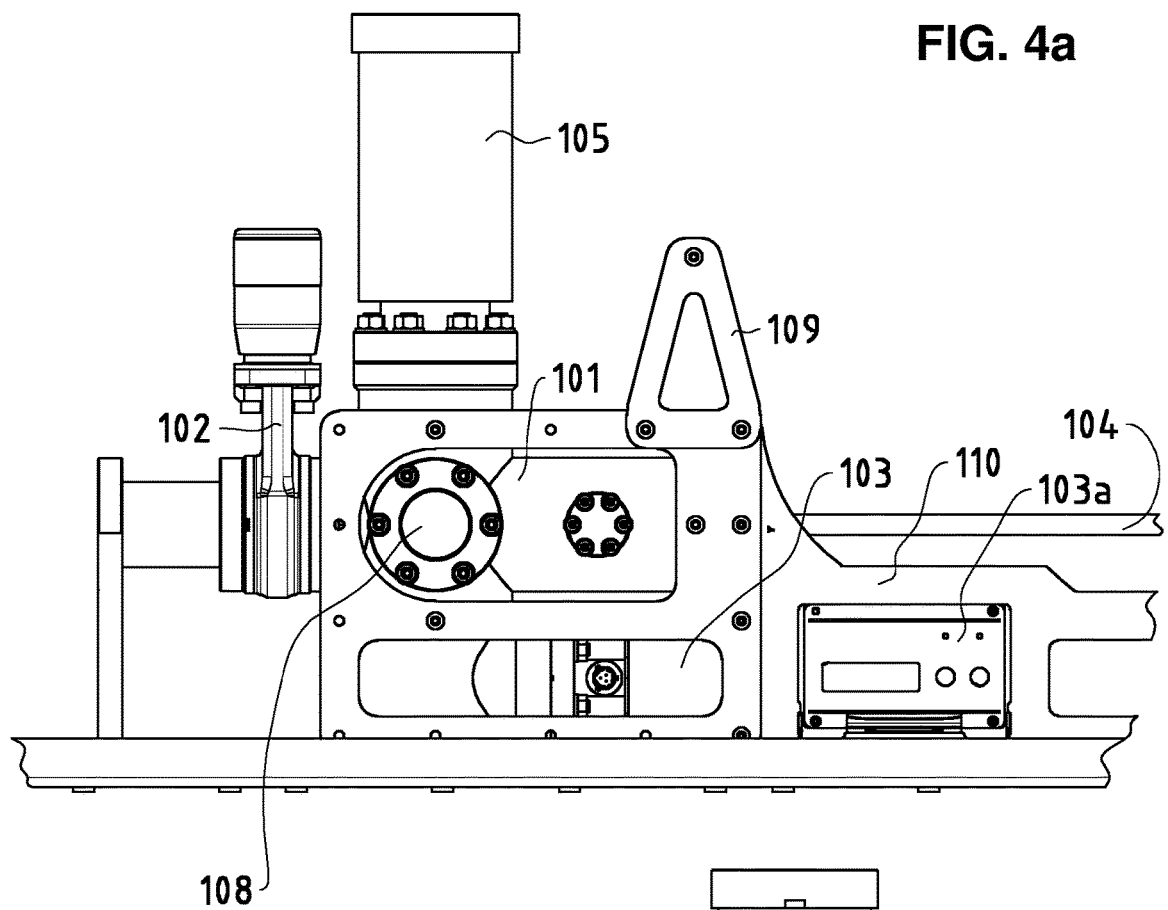
FIG. 4a shows a side view of the device according to a first embodiment of the present invention.
Figure 4B:
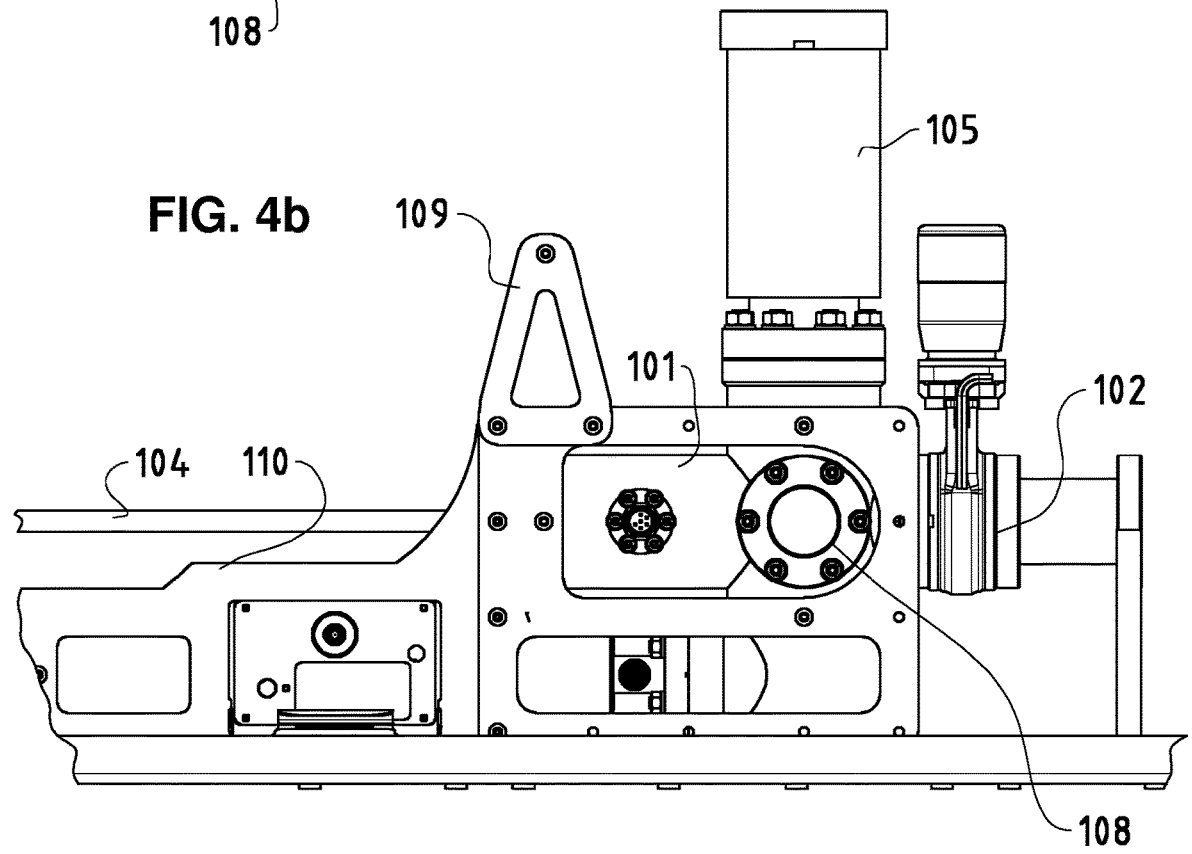
FIG. 4b shows a side view of the device according to a first embodiment of the present invention.

As illustrated in FIGS. 1, 4a and 4b, the flange 101g is, in this particular embodiment, closed by a blind flange. However, flange 101g could be used to add functional features such as electrical or mechanical feedthroughs or vacuum windows to the suitcase 100, as exemplified with the flange 101h to which electrical feedthroughs are attached. The latter are for example used to read out signals from temperature sensors provided to measure the temperature of cooling shield 106, cooling block 107, sample holder 2 and/or sample 1 itself. These feedthroughs can also be used to pass electrical current to a heater inside chamber 101, that can be used for to adjust the temperature of sample 1 and/or of cooling shield 106.

Finally, and as illustrated in FIGS. 4a and 4b, two vacuum windows 108 are attached to the flanges 101e and 101f of the chamber 101. The handle 109 as well as the rails 110 allows for comfortable and secure transport of the UHV suitcase 100. As shown in FIG. 1, the rails 110 of this preferred embodiment comprise a span that is configured to accept the controller 103a of the non-evaporable getter ion combination pump 103. The pump controller 103a is battery powered therefore the pressure inside the chamber 101 can be monitored all the times during transport. The controller 103a has the additional functionality of a temperature control and display. When connected to one or more temperature sensors of the cooling shield 106 or the sample 1 (see below for more details), the controller will emit an acoustic alarm when the measured temperature attains a predetermined critical temperature.

Figure 3:
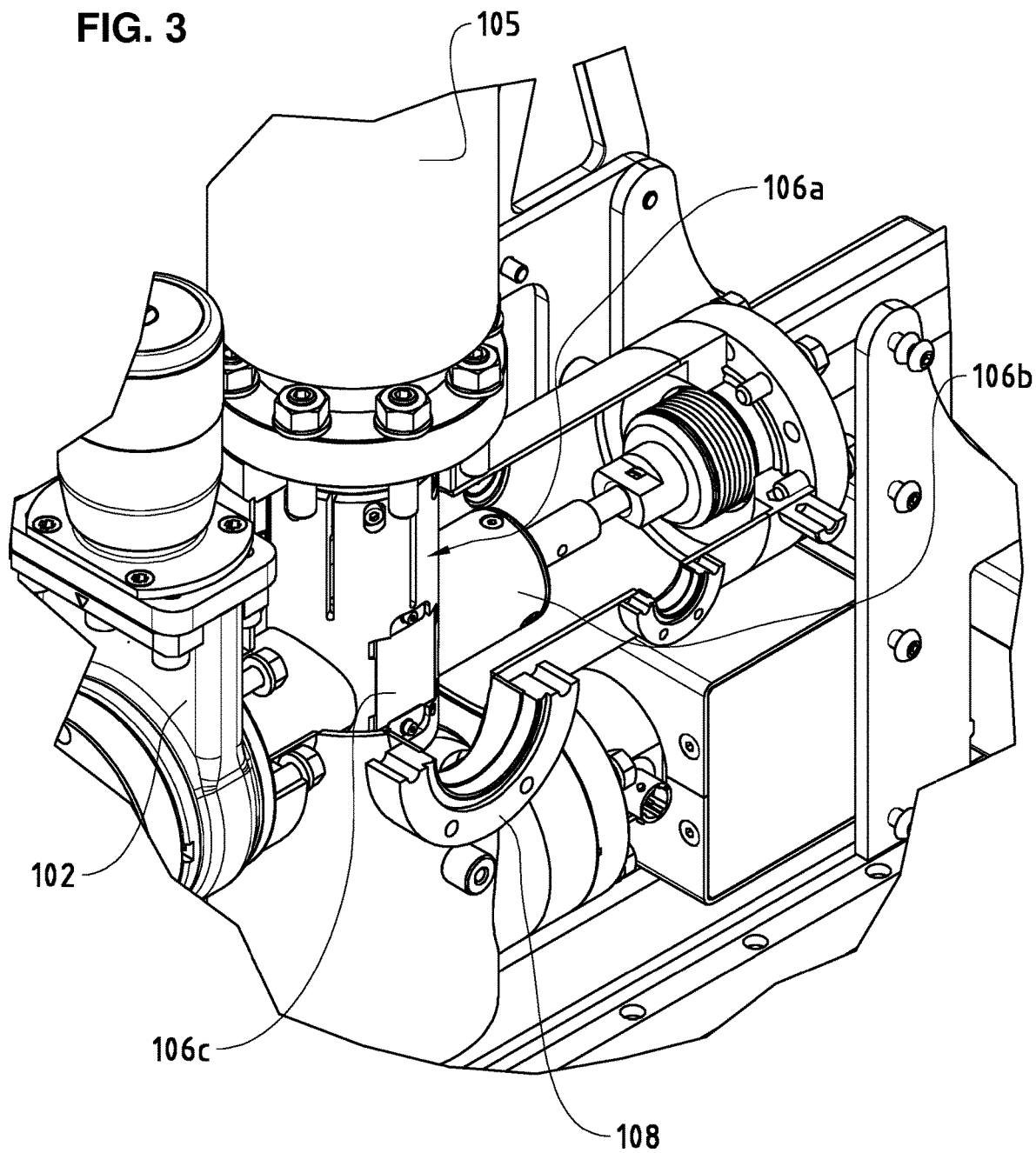
FIG. 3 shows the inside of the vacuum chamber of the device according to a first embodiment of the present invention.

As shown in FIG. 3, the cooling shield 106 comprises, opposite to the vacuum windows 108, openings 106c. These openings 106c are advantageously covered by plates made out of an optically transparent and heat reflective material. This allows, together with vacuum windows 108, for optical access to sample 1 from outside the chamber 101, while sample 1 is kept at low temperature inside the cooling shield 106. Thanks to the plates covering the openings 106 it is possible to minimize heat loss or the warming of sample 1 by heat radiation. With openings 106c and windows 106, it is therefore possible to perform measurements, for instance optical spectroscopy, on sample 1 kept at low temperature inside the cooling shield 106.

Figure 5A:
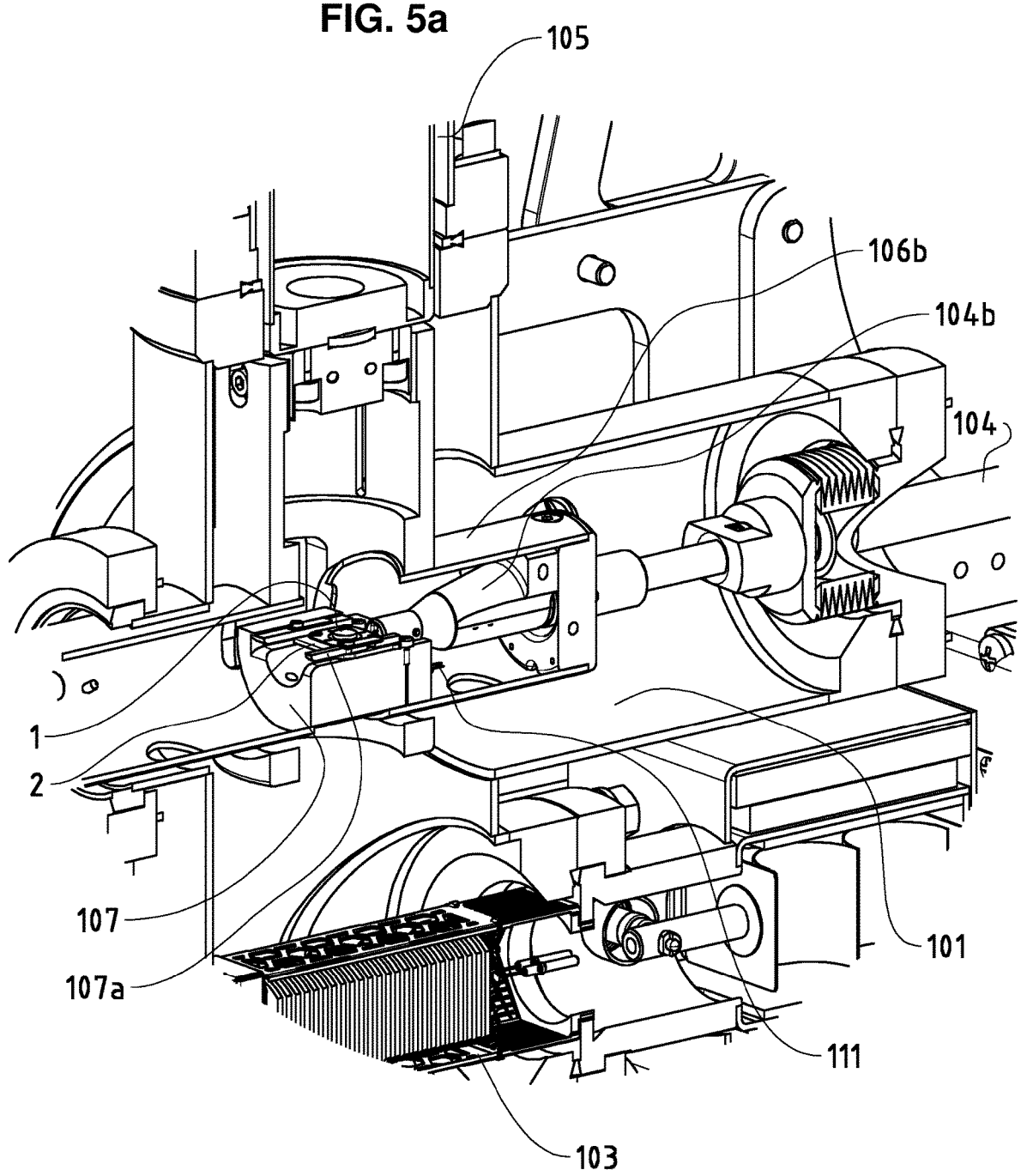
FIG. 5a shows a perspective view of the inside of the cooling shield of the device according to a first embodiment of the present invention.
Figure 5B:
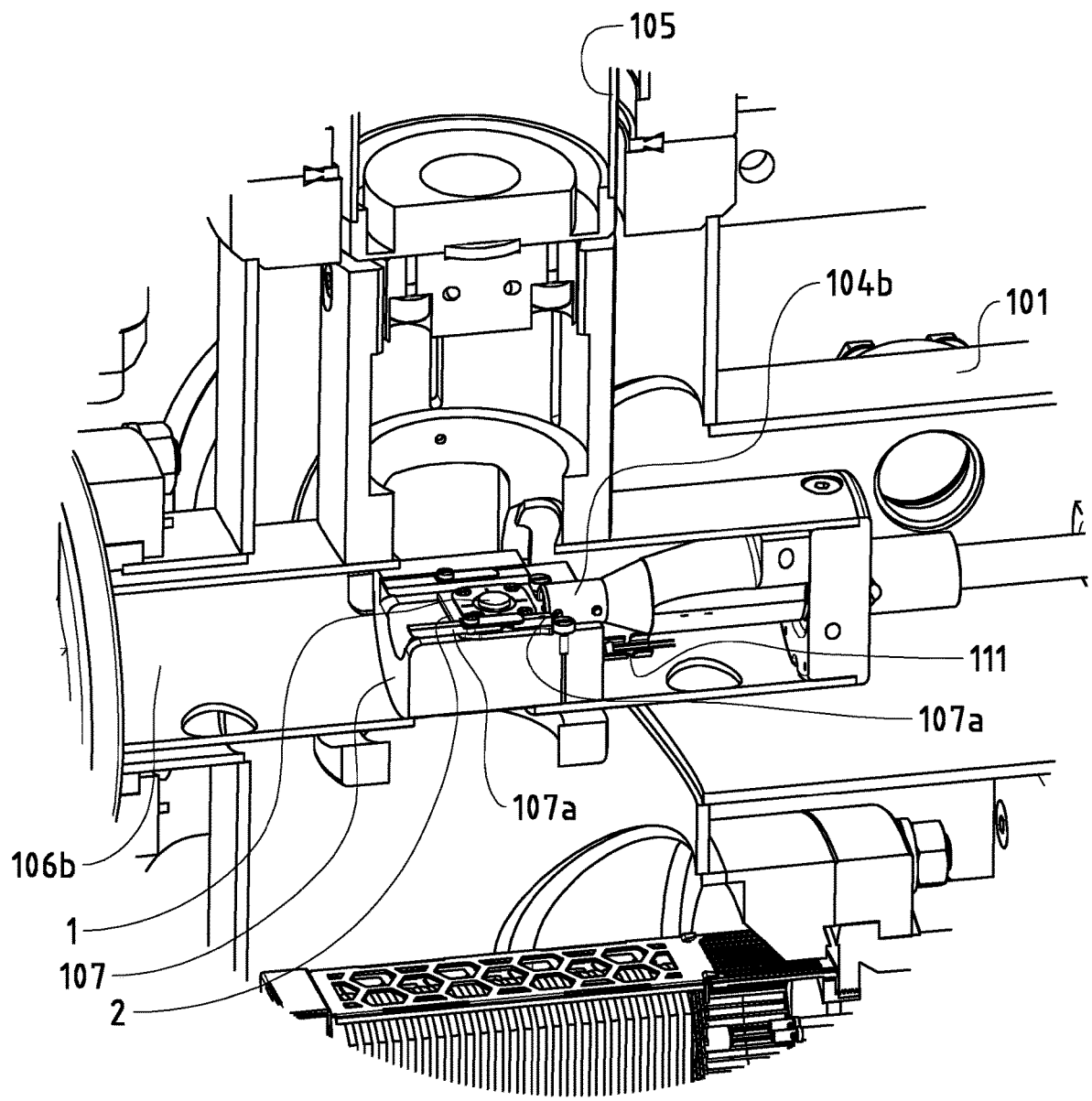
FIG. 5b shows another perspective view of the inside of the cooling shield of the device according to a first embodiment of the present invention.

As can be seen in FIGS. 5a and 5b, which are perspective views of the inside of cooling shield 106, the cooling block 107 takes in this preferred embodiment the form of a half cylinder directly attached to the part 106b of the shield 106. The shield 106 and the block 107 are advantageously both made out of a vacuum compatible material with a high thermal conductivity as for example copper, beryllium copper or AlMgSi1.

The sample holder 2 carrying sample 1 can be mounted and kept in place on cooling block 107 by means of plate springs 107a. A temperature sensor 111, for instance a thermocouple sensor or a resistance temperature detector, as for example a Pt100 sensor, is attached to the cooling block 107 to measure its temperature. Of course, further temperature sensors can be provided, for instance for measuring the temperature of the shield 106, of the sample holder 2 or of sample 1.

The transfer rod head 104b, in the embodiment presented in FIGS. 5a and 5b, can grab or release sample holder 2 by means of a gripper known from the state of the art. The head 104b is made advantageously out of a material with high thermal conductivity such as copper or CuBe2, this ensures that the head 104 possesses a large thermal mass. With this, once the thermal contact between the sample holder 2 and the cooling block 7 is interrupted in order to transfer the sample 1, the sample 1 stays at cryogenic temperature for a long period of time. Furthermore, the head 104b and the rod 104 are connected by means of a bushing made out of a material with low thermal conductivity, such as a thermoplastic, for instance polyether ether ketone (PEEK) or polyamide-imide. This ensures that heat from the transfer rod 104, which is normally at room temperature, is not transferred to sample holder 2 and eventually to sample 1.

The sample holder 2 is designed in such a way that good thermal contact is obtained between sample 1 and sample holder 2. On the other hand, the thermal contact between sample holder 2 and cooling block 107 is designed such that a temperature difference of 10 K to 20 K is obtained between sample 1 and cooling shield 106. This is advantageous since it guarantees that sample 1 is kept at a temperature slightly higher than cooling shield 106 all the time cooling shield 106 is at a temperature lower than the temperature of chamber 101. This ensures that sample 1 does not act as a cryogenic pump. Residual gas molecules inside the cooling shield 106 are rather "pumped" or captured by the cooler surface of the shield 106 than by sample 1. Since the cooling shield 106 acts as a cryogenic pump all the time it is kept at low temperature, the "local" pressure around sample 1 is lowered. This permits to keep sample 1 uncontaminated for an even longer time.

Figure 6:
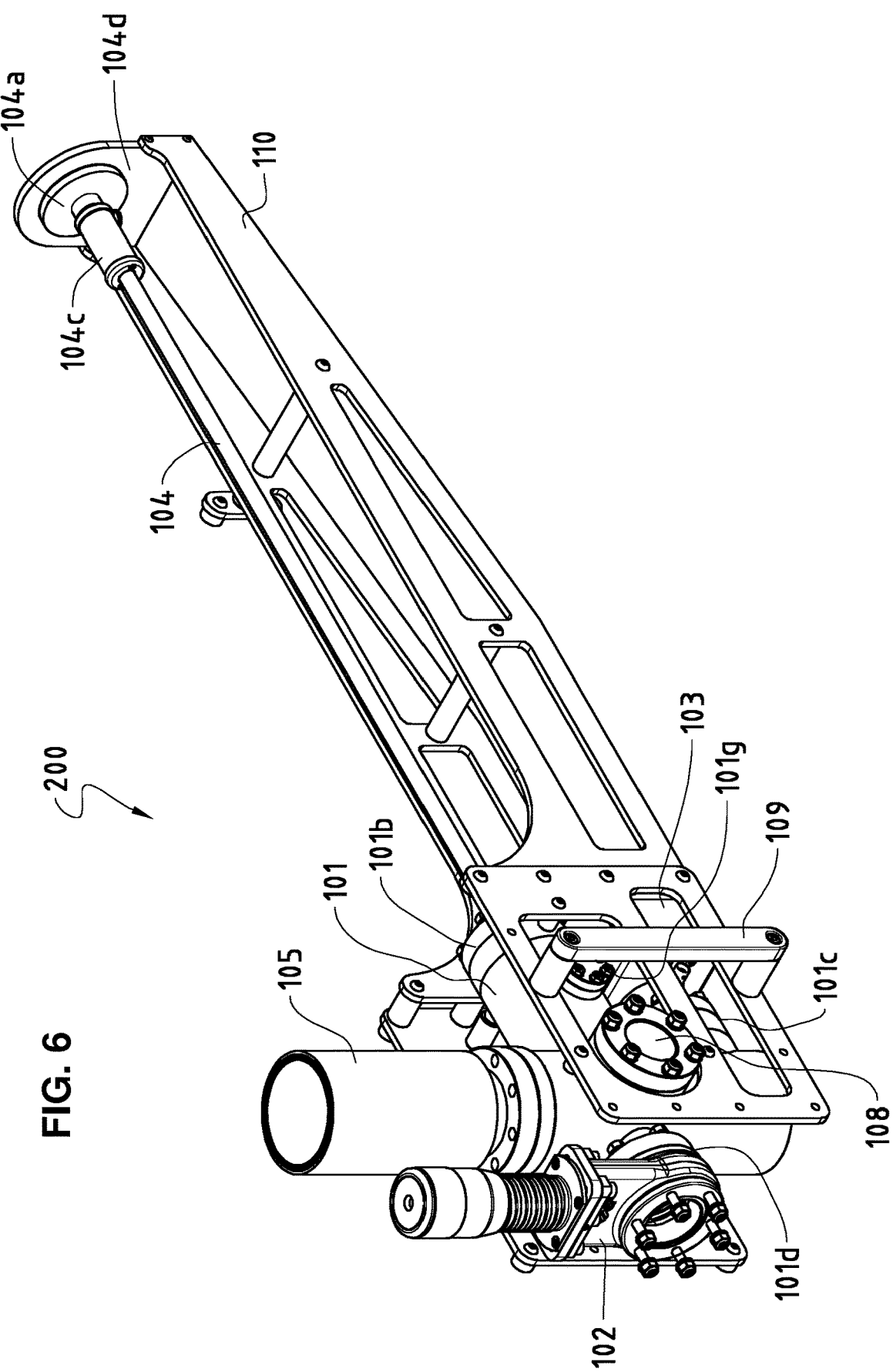
FIG. 6 is a schematic perspective view of a device according to a second embodiment of the present invention.
Figure 7A:
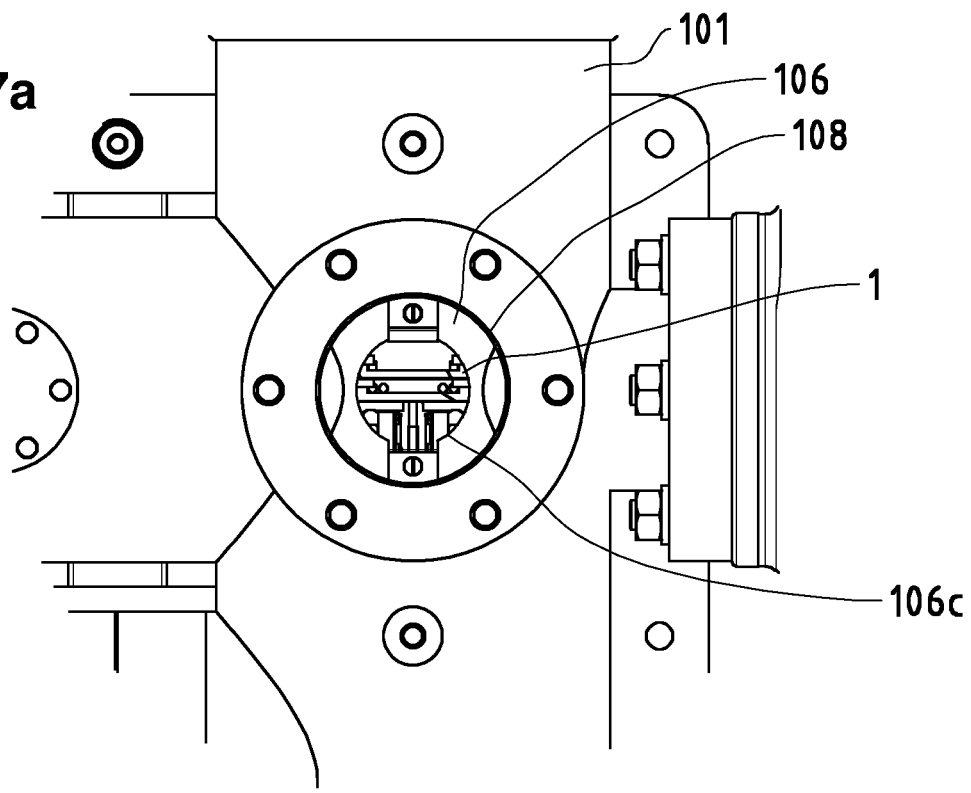
FIG. 7a shows a side view of the device according to the second embodiment of the present invention, whereas the optically transparent and heat reflective material covering an opening of the cooling shield is omitted.
Figure 7B:
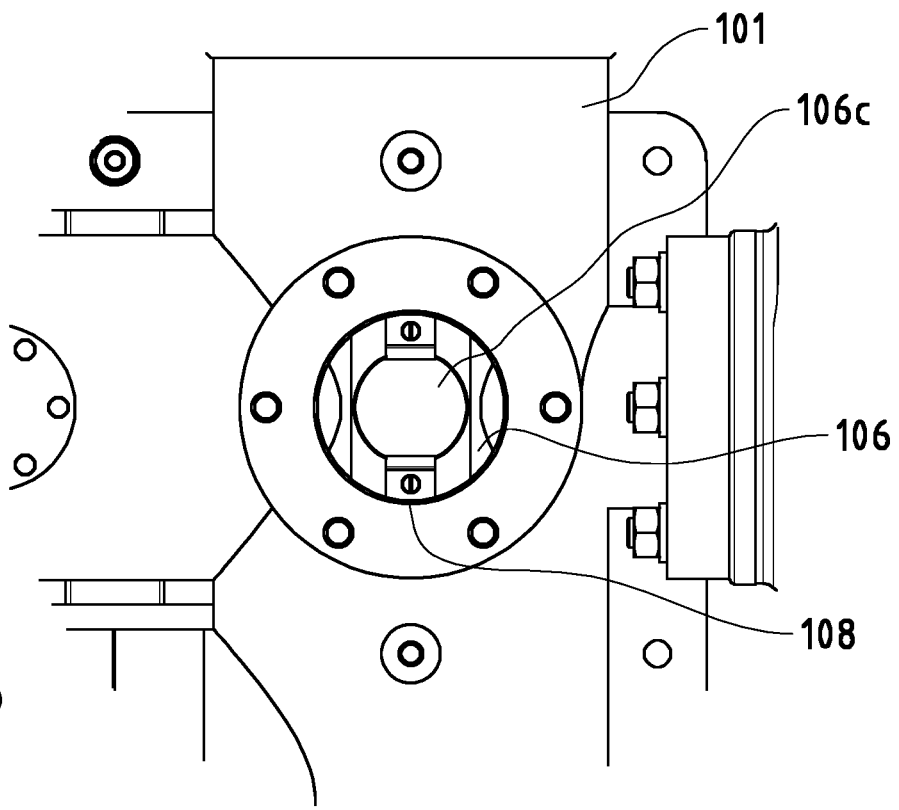
FIG. 7b shows a side view of the device according to the second embodiment of the present invention, whereas the optically transparent and heat reflective material covering an opening of the cooling shield is shown.

FIG. 6 shows a UHV suitcase 200 according to a second preferred embodiment of the present invention. Parts or components which were already described in relation to the first embodiment maintain here their reference number. Suitcase 200 is, viewed from the outside, similar to suitcase 100. However, differences exist and consist for instance in the position of the handle 109. As illustrated in FIGS. 7a and 7b, the cooling shield 106 of the suitcase 200 comprises also openings 106c for optical access to sample 1. The openings 106c are advantageously covered by plates made out of an optically transparent but heat reflective material.

Figure 8:
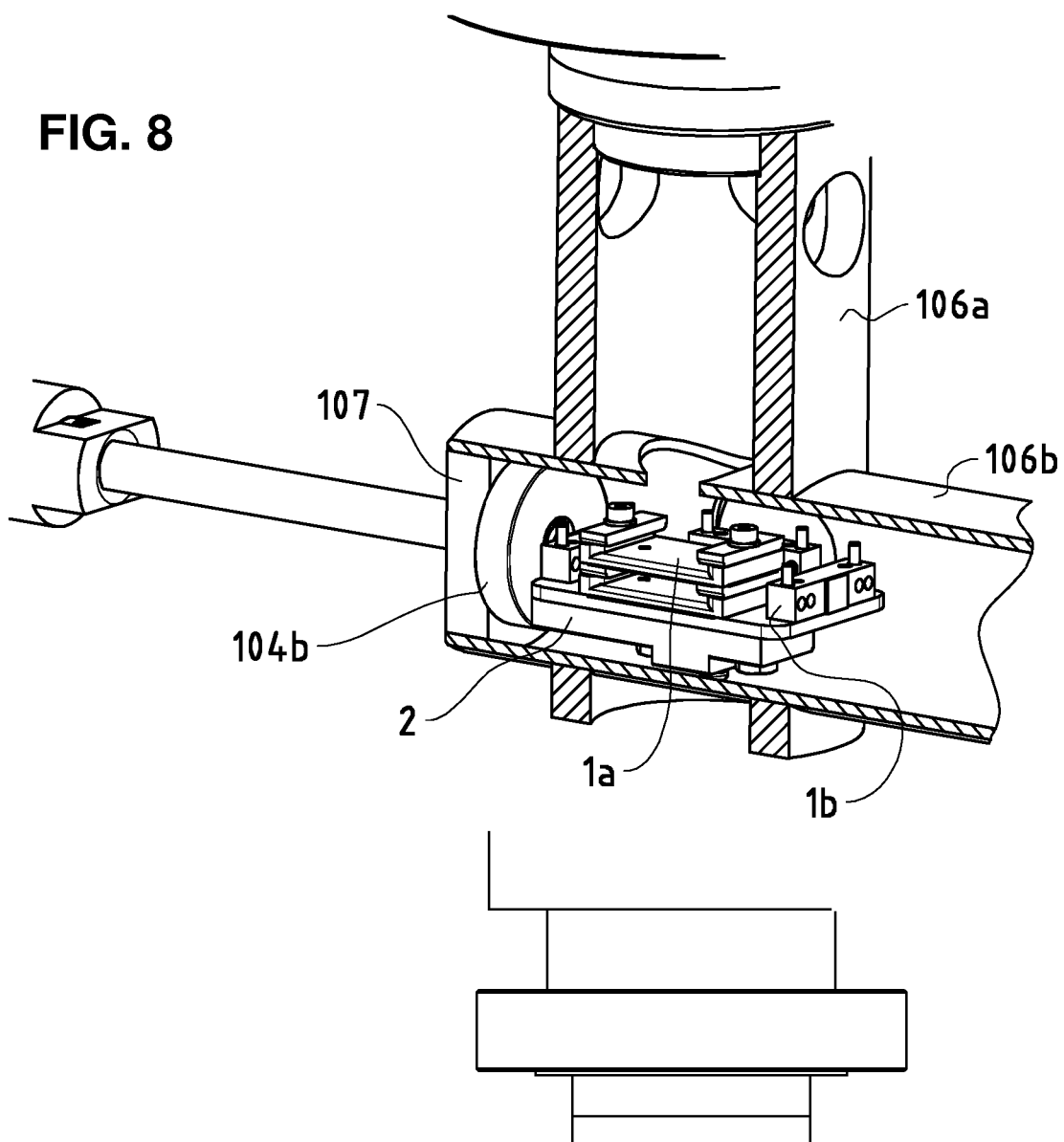
FIG. 8 shows a perspective view of the inside of the cooling shield of the device according to the second embodiment of the present invention.
Figure 9:
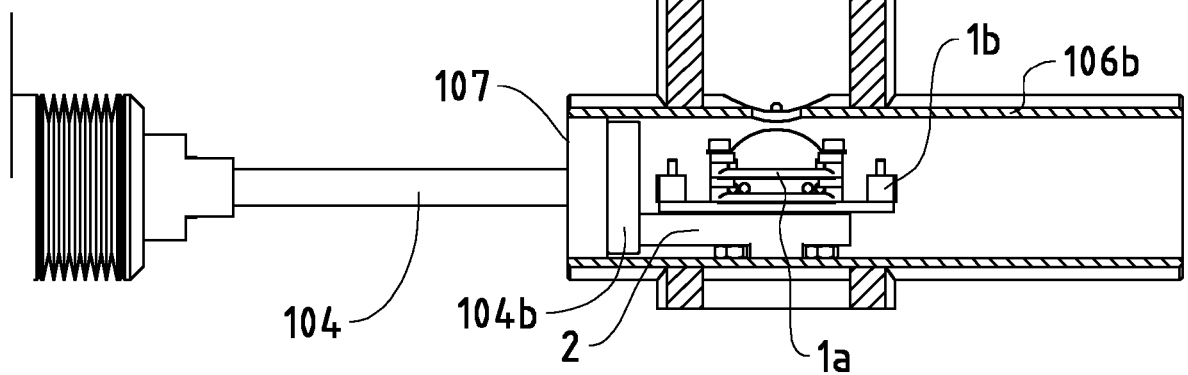
FIG. 9 shows a side view of the inside of the cooling shield of the device according to the second embodiment of the present invention.

As displayed in FIGS. 8 and 9, the sample holder 2 of suitcase 200 is different from that of suitcase 100. The holder 2 of suitcase 200 is designed to carry at the same time several samples 1a and 1b that can be of different types. The holder 2 can further be rotated around an axis perpendicular to that of the transfer rod 104. In other terms, the holder 2 takes the function of a carousel.

In suitcase 200, the transfer rod head 104b carries the holder 2 and is pressed against cooling block 107 in order to cool down sample holder 2 and samples 1a and 1b. As can be seen in FIGS. 8 and 9, the cooling block 107 is, in this embodiment, a plate directly attached, for instance welded, to the part 106b of the shield 106. In this embodiment as well, the thermal contacts are designed such that there is a temperature difference, advantageously of approximately 10 K to 20 K, between shield 106 and sample 1, in order to avoid contamination of sample 1. A temperature sensor 111 (not shown here), for instance a thermocouple or a resistance temperature detector, as for example a Pt100 sensor, is provided to measure the temperature of cooling block 107. Of course and similar to suitcase 100, further temperature sensors can be foreseen to measure the temperature of sample holder 2 and/or samples 1a and 1b.

Figure 10:
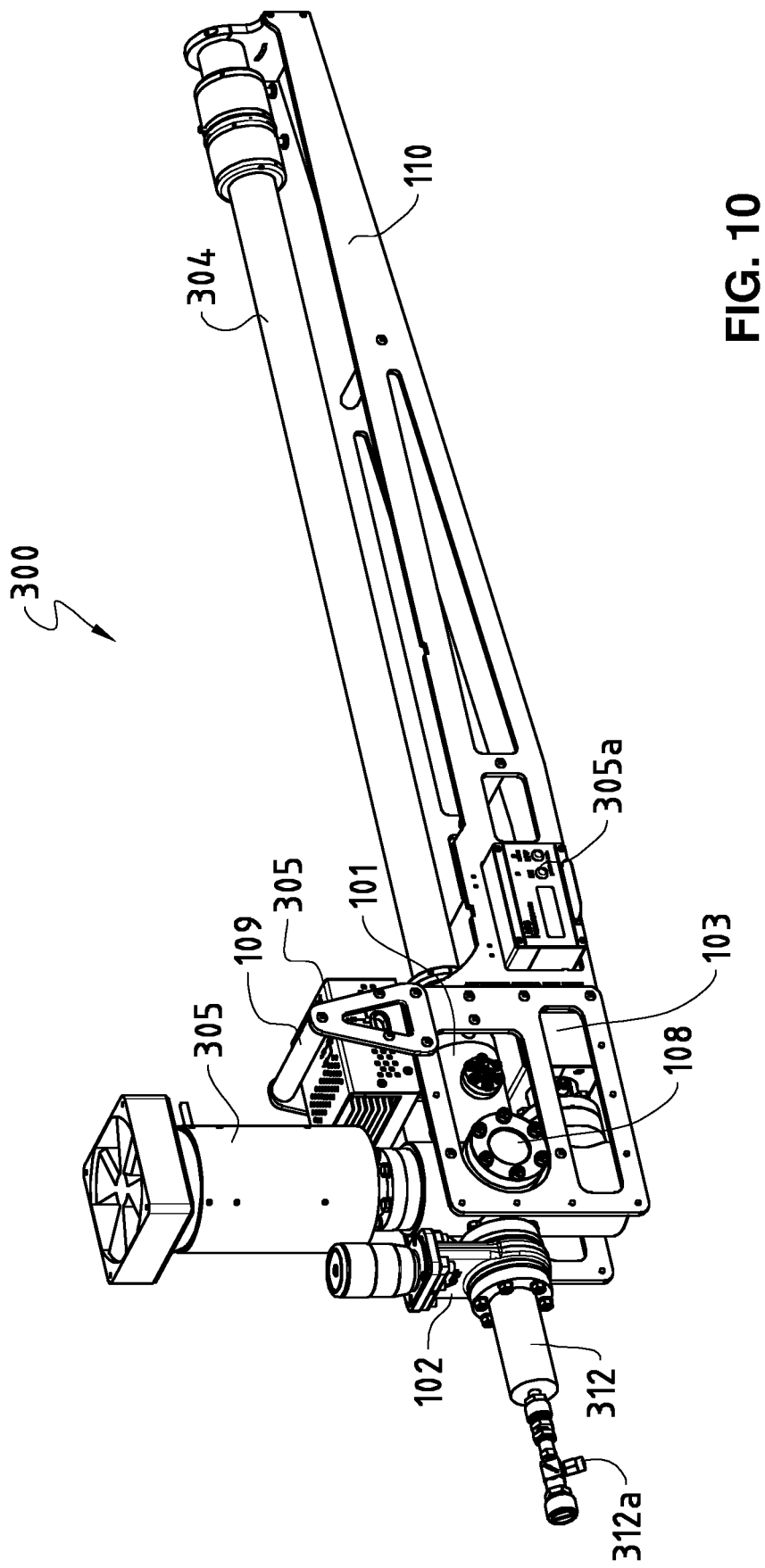
FIG. 10 is a schematic perspective view of a device according to a third embodiment of the present invention.

FIG. 10 shows a perspective view of a UHV suitcase 300 according to a third preferred embodiment of the present invention. The suitcase 300 possesses instead of a wobble-stick a linear feedthrough 304. The alignment of the longitudinal axis of the linear feedthrough 304 in directions X, Y and Z and towards a recipient stage in the apparatus to which the sample 1 shall be transferred can be obtained for instance by means of a hexapod port aligner 500 attached to valve 102 (cf. below for more details).

In this preferred embodiment, cooling is not obtained by means of LN2 but by a mechanical cooler 305. In this particular embodiment, the mechanical cooler 305 is a Stirling cooler. A controller 305a is provided for controlling and powering of the cooler 305. Regulation and control of cooler 305 is achieved, for instance, on the basis of the temperatures measured by one or more sensors mounted in the UHV chamber 101, on the cooling shield 106, on the cooling element 107 on the sample holder 2 or on the sample 1 itself. The controller 305a is powered during transport with a 24 V rechargeable battery or by means of a vehicle power supply via a voltage converter. This allows for transporting sample kept at low temperature for very long time and over very long distance. Controller 305a can advantageously be coupled to a laptop computer via a serial interface for programming.

The major advantage of UHV suitcase 300 in comparison to suitcases 100 and 200 is given by the fact that no LN2 is required for cooling sample 1. First, this permits for a safer transport without the risk of injury due to contact with LN2 and second it allows for a constant cooling of sample 1 without the need of periodically filing of LN2 in the Dewar. This also allows for transporting sample 1 by airplane. Transport by airplane with a suitcase using LN2 is forbidden. Furthermore, by means of mechanical cooler 305 it is possible to cool down the cooling shield to 40 K. It is therefore possible to transport the sample at much lower temperature than with a transport system using LN2 as cooling medium.

Figure 11:
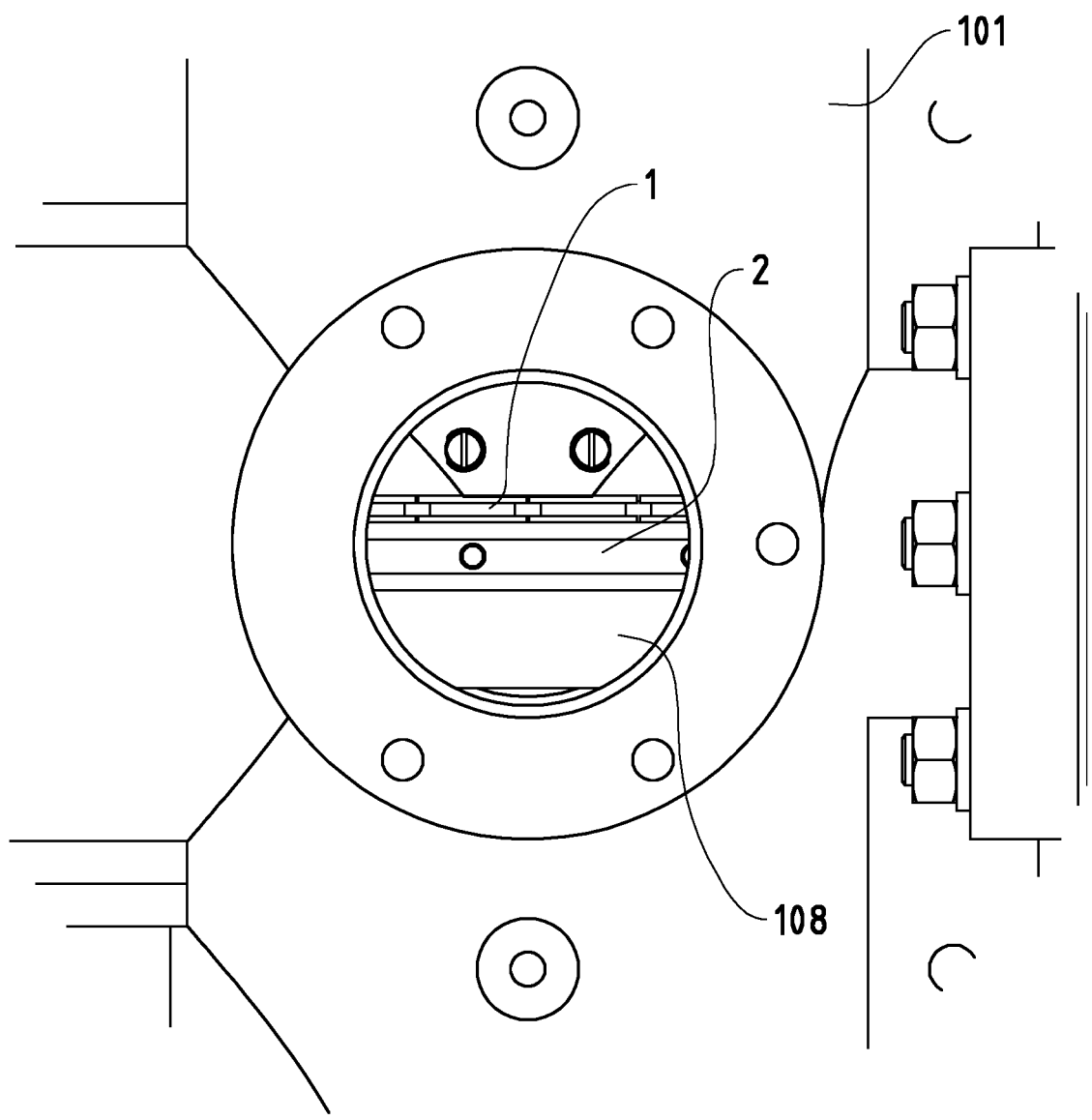
FIG. 11 shows a side view of the device according to the third embodiment of the present invention, whereas the optically transparent and heat reflective material covering an opening of the cooling shield is omitted.
Figure 12:
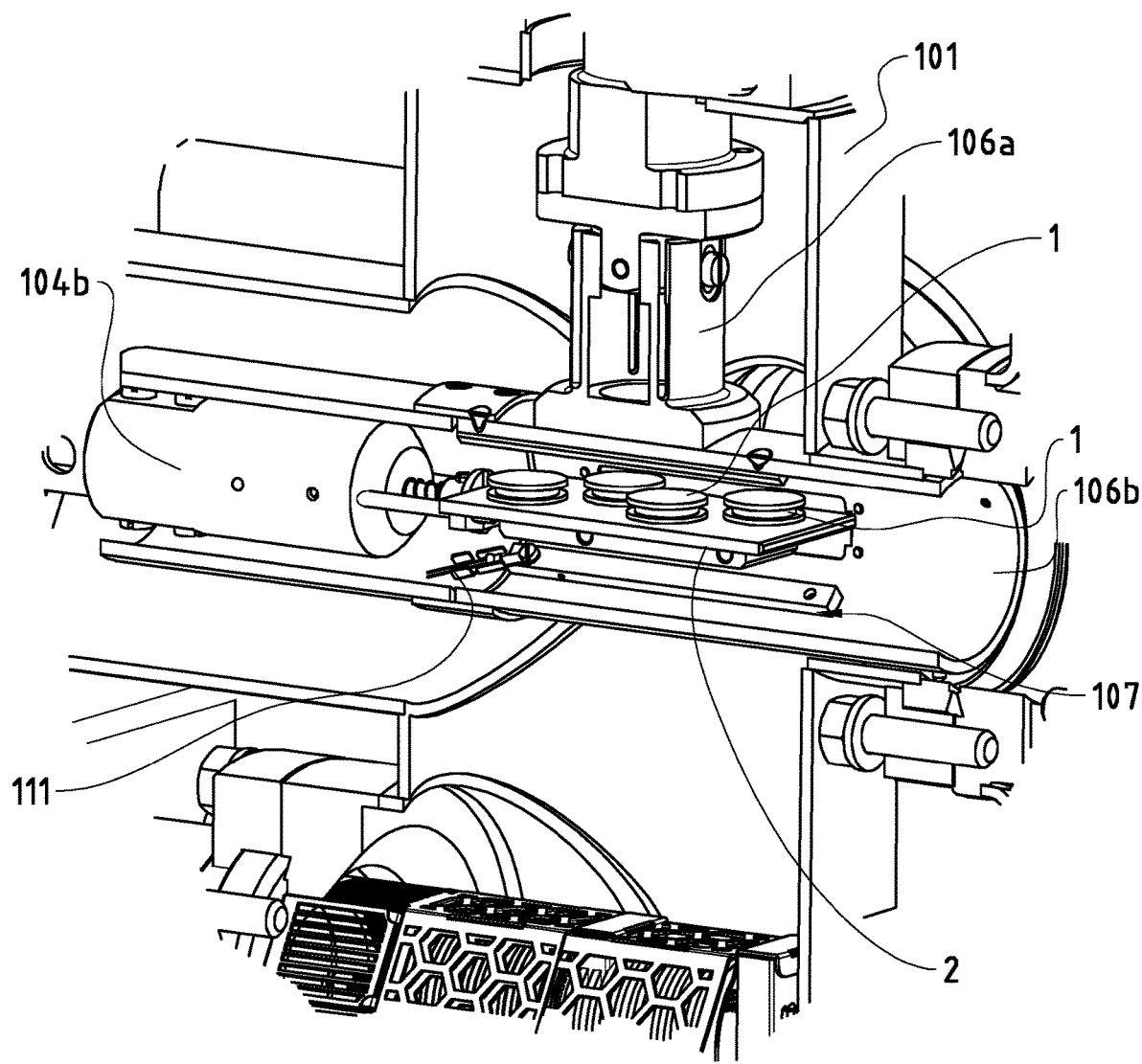
FIG. 12 shows a perspective view of the inside of the cooling shield of the device according to the third embodiment of the present invention.

As can be seen in FIG. 11, vacuum windows 108 and openings 106c are also provided in suitcase 300 and these permit optical access to the sample 1 while it is kept at low temperature. Thus it enables measurements of sample properties by optical means, as for instance optical spectroscopy. As shown in FIG. 12, the cooling block 107 of UHV suitcase 300 takes the form of a bar which is screwed on shield 106. In order to cool the sample holder 2 and consequently samples 1, the sample holder 2 is rotated by means of the linear feedthrough 104 and pressed against the cooling bar 107. A temperature sensor 111, for instance a thermocouple or a resistance temperature detector, as for example a Pt100 sensor, is provided for measuring the temperature of the cooling block 107. Once again, the thermal contacts between the cooling shield 106 and the cooling bar 107 and/or between the cooling bar 107 and the sample holder 2 are designed such that samples 1 are kept at a temperature higher by 10 K to 20 K than the shield 106. A heater (not shown here), for instance a resistant heater, is provided and mounted under the sample holder in order to adjust the temperature of samples 1. The manipulation head 104b is made of a material of low thermal conductivity, for instance a thermoplastic such as PEEK or polyaminide-imide, to avoid heat transfer from the linear feedthrough 104 to the sample holder 2.

With the gate valve 102 of the suitcases 100, 200, 300 or 600, it is possible to close UHV chamber 101 whenever the transport system is not connected to an analysis or preparation chamber. Since the sealing element of the vacuum gate valve 102 is usually an elastomer seal which has an inadequate high permeation rate for ultra-high vacuum applications of $<10^{-9}$ mbar, it is advantageous when a long transport time is foreseen that the "air side" of the gate valve 102 is also evacuated. For this purpose, a pipe 312, that defines a so-called buffer volume, is attached to the gate valve 102 (cf. FIG. 10). This buffer volume can be pumped down by a small mechanical pump, advantageously a dry pump, as for instance a membrane pump or a scroll pump, through the connector 312a. The buffer volume evacuated to a pressure of approximately 5 mbar reduces the diffusion of gases through the elastomer seal of valve 102 sufficiently so that a working pressure in chamber 101 of $<10^{-10}$ mbar can be kept stable for several months without any problems. This permits to transport a sample under UHV conditions over long distances. Prior to attaching the UHV suitcase to the apparatus to which the sample shall be transferred, the buffer volume is vented and the pipe 312 detached from gate valve 102.

Figure 19:
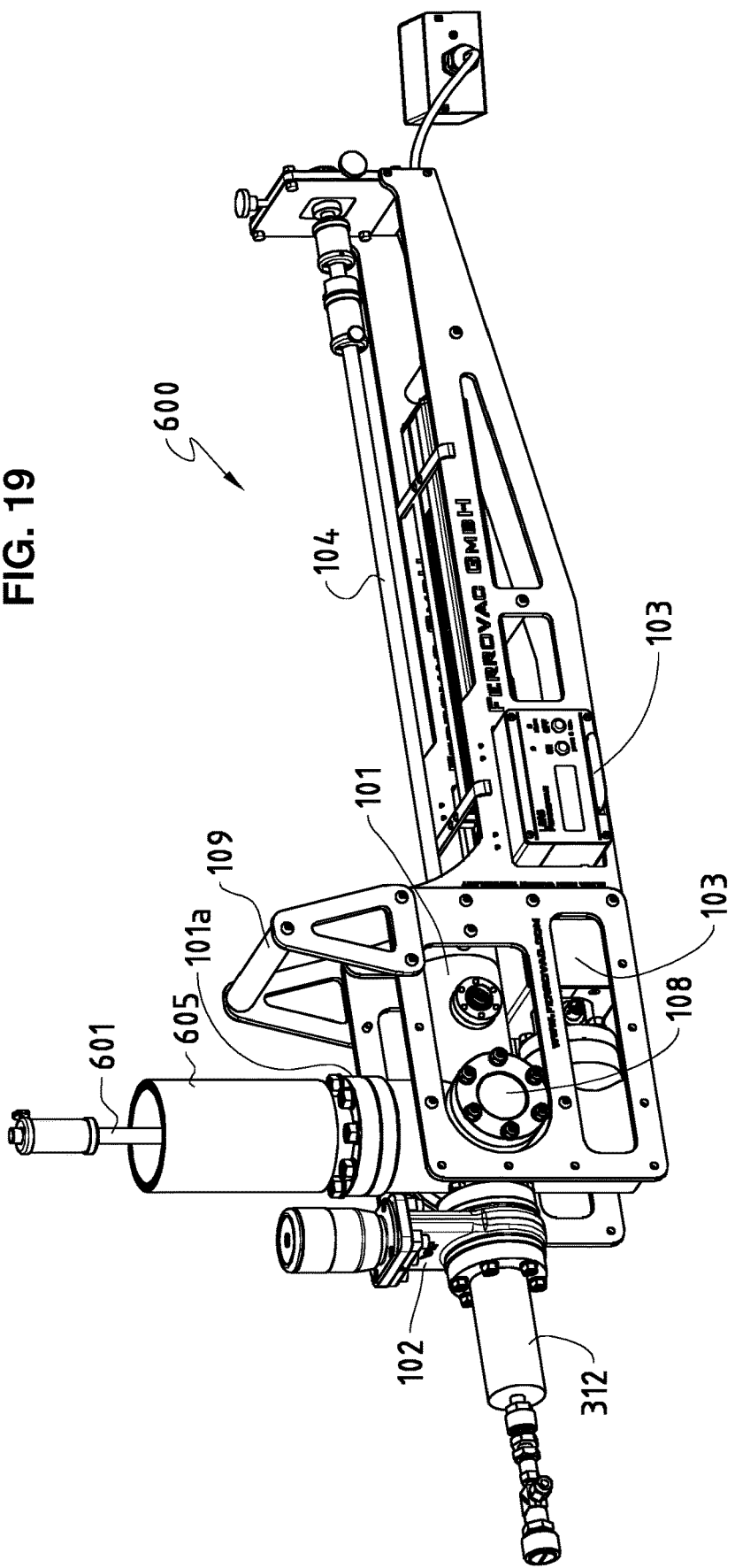
FIG. 19 is a schematic perspective view of a device according to a fourth embodiment of the present invention.

FIG. 19 shows a UHV suitcase 600 according to a fourth preferred embodiment of the present invention. Parts or components which were already described in relation to the previous embodiments keep their reference number. Suitcase 600 is, viewed from the outside, very similar to suitcase 100. However, important differences exist. The UHV suitcase 600 comprises a parking linear-feedthrough 601 that is mounted inside the Dewar 605 and that is attached to the vacuum flange 101a. As it will be explained in more details below, the parking-linear feedthrough 601 can be cooled down at the same time as the cooling shield 106 by pouring LN2 inside to Dewar 605. Inside the chamber 101, a sample parking stage 602 is attached to the linear feedthrough 601. The sample parking stage 602 can therefore easily be cooled to cryogenic temperature.

Figure 20:
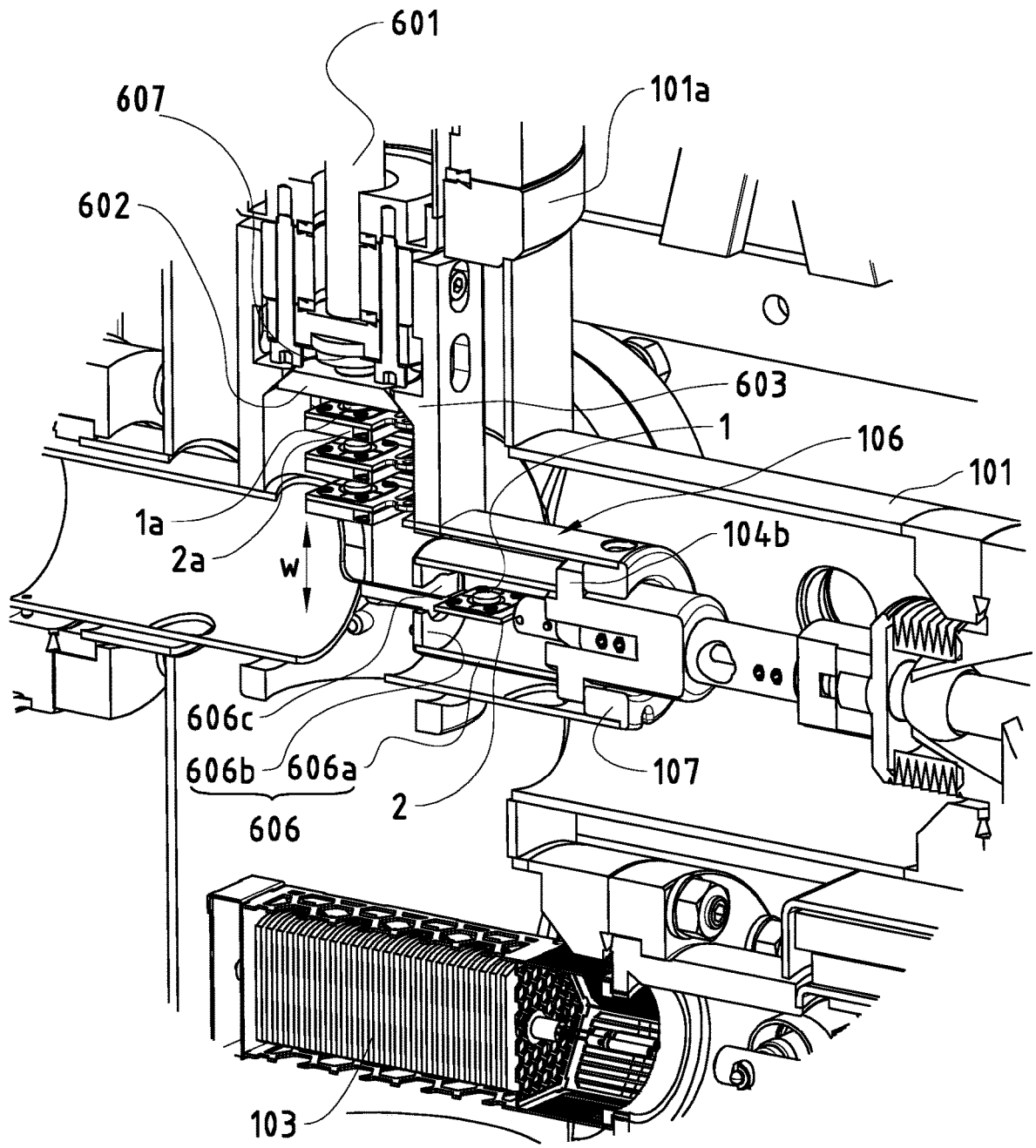
FIG. 20 shows the inside of the vacuum chamber of the device according to a fourth embodiment of the present invention where the sample is inside the sample shield and the sample parking stage in its upper position.

As can be seen in FIG. 20, which is an inside view of the chamber 101 of UHV suitcase 600, the parking sample stage 602 can carry several sample holders 2a on which samples 1a are mounted. In order to efficiently cool the parking sample stage 602, it can be pressed against the parking cooling block 603, which is in thermal contact with the bottom of the Dewar 605. Thanks to the linear feedthrough 601, the parking sample stage 602 can be moved along the direction W. A specially designed slide bearing 607 made out of, sapphire, advantageously monocrystalline sapphire, ensures that the shaft of the linear rotary feedthrough 601 is sufficiently cooled, even when the parking sample stage is lowered and thus no longer pressed against the parking cooling block 603. The cylindrical sapphire slide bearing 607 is segmented and the segments are spring loaded and pressed to the manipulator shaft by a defined force (not shown here). Spring loading of the segmented bearing ensures that the shaft of the linear rotary feedthrough does not get stuck upon cooldown due to different coefficient of thermal expansion of the materials involved. The sapphire segments are mounted and enclosed inside a copper ring, which is mounted in the center of the bottom flange of the LN2 Dewar. The shaft of the linear rotary feedthrough is made out of a hard metal with a good thermal conductance, for instance CuBe2 or Molybdenum. Shaft and Sapphire bearing surfaces are polished Ra 0.1 in order to minimize friction. This new principle of cooling of a movable shaft is adaptable to all kinds of motion feedthroughs for cryo-vacuum applications, including wobblestick manipulators.

The UHV suitcase 600 comprises the cooling shield 106 with openings 106*c* (not shown here) for optical access to sample 1. The openings 106*c* are advantageously covered by plates made out of an optically transparent but heat reflective material.

Figure 21:
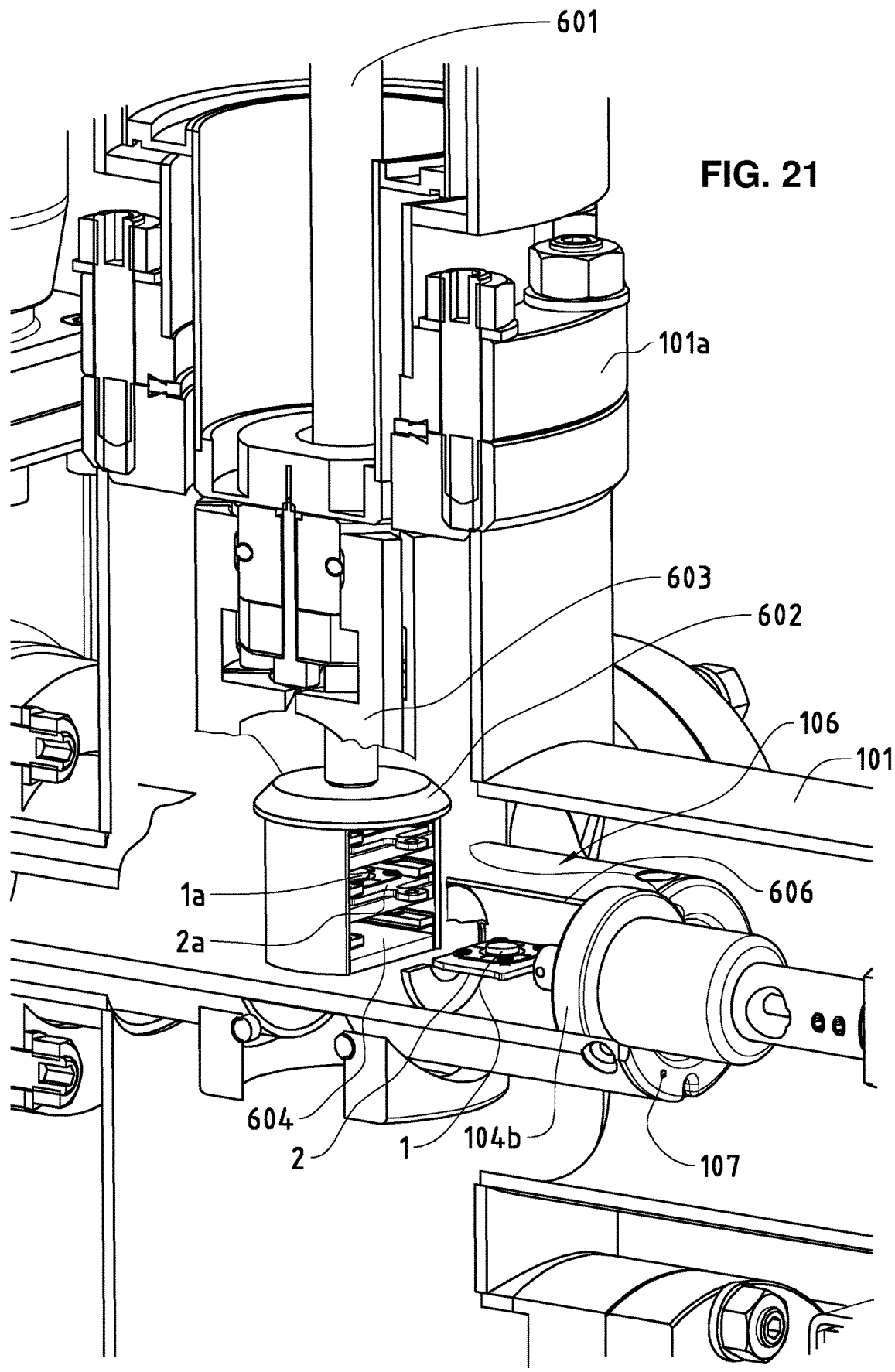
FIG. 21 shows the inside of the vacuum chamber of the device according to a fourth embodiment of the present invention where the sample is inside the sample shield and the sample parking stage in its lower position.
Figure 22:
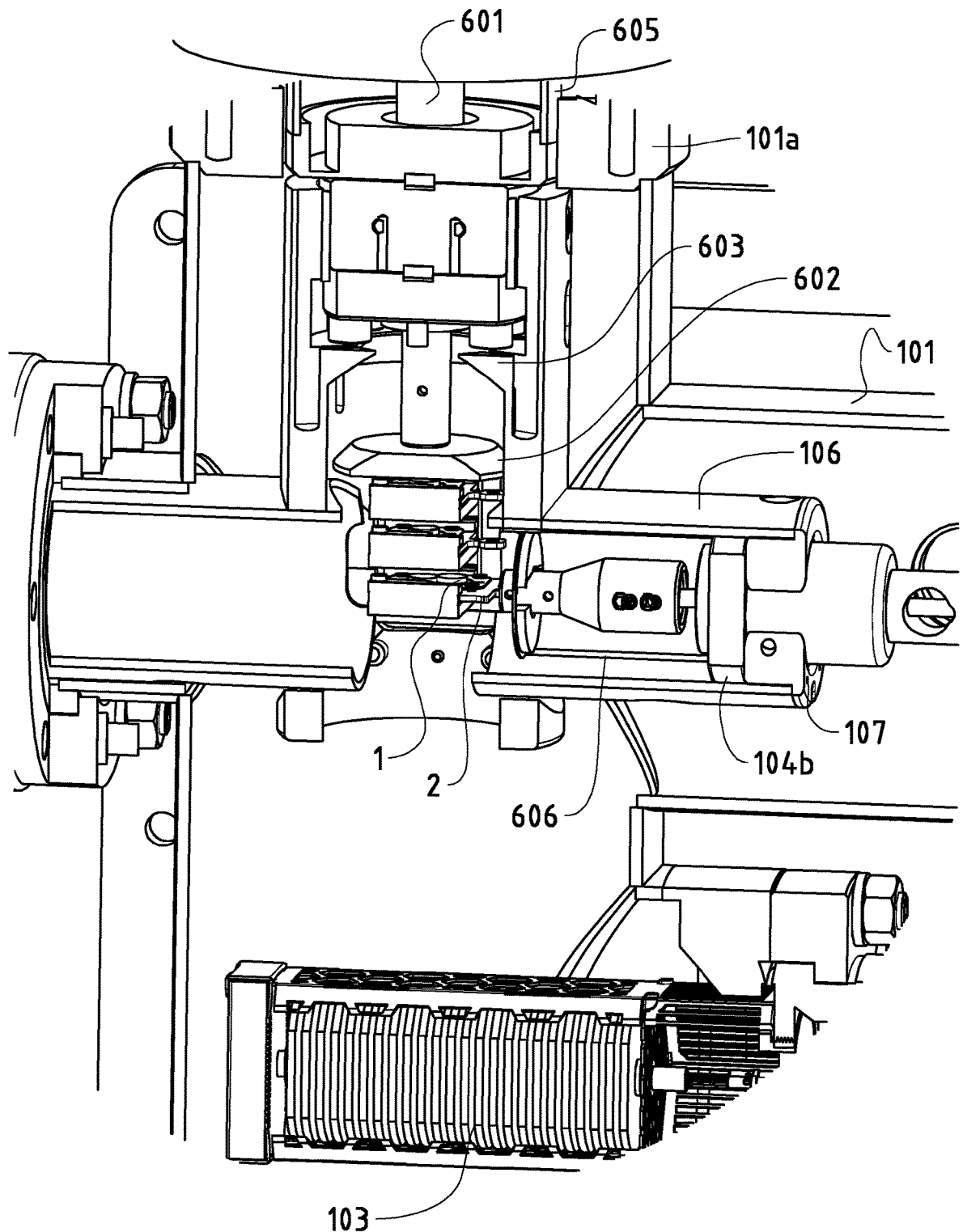
FIG. 22 shows the inside of the vacuum chamber of the device according to a fourth embodiment of the present invention where the sample was moved outside the sample shield and the sample parking stage in its lower position.

In suitcase 600, the transfer rod head 104*b* carries the holder 2 and is pressed against cooling block 107 in order to cool down sample holder 2 and sample 1. As can be seen in FIGS. 20 to 22, the cooling block 107 takes the form, in this embodiment, of a plate directly attached to the shield 106. In this embodiment as well, the thermal contact between the cooling block 107 and the transfer head 104*b* is designed such that a temperature difference exists, advantageously of approximately 10 K to 20 K, between shield 106 and sample 1, in order to avoid contamination of sample 1. A temperature sensor 111 (not shown here), for instance a thermocouple or a resistance temperature detector, as for example a Pt100 sensor, is provided to measure the temperature of cooling block 107. Of course and similar to suitcases 100, 200 and 300, further temperature sensors can be foreseen to measure the temperature of sample holder 2 and/or sample 1.

Besides the cooling shield 106, UHV suitcase 600 comprises a sample shield 606 with a cylindrical part 606*a* and a cover cap 606*b*. The latter comprises itself an opening 606*c* essentially in the form of a slit. As can be seen from FIGS. 20 to 22, the sample shield 606 is directly attached to the transfer head 104*b* and adopts therefore at all time the same temperature. In order to have optical access to the sample 1, while it is kept inside the sample shield 606, the latter is advantageously made out of a transparent material with high thermal conductivity such as for instance sapphire.

The presence of the sample shield 606 in suitcase 600 has the tremendous advantage that the sample is surrounded by cooled surfaces not only during the transport (as it is the case for the suitcases 100, 200 and 300) but also during the transfer step to the vacuum chamber in which the sample need to be transferred itself. Indeed, the linear transfer rod 104 of suitcase 600 is a so-called dual shaft linear feedthrough that permits on the one side to change the position of the sample shield 606 and sample 1 with respect to the cooling shield 106, respectively the chamber 101, and on the other side to change the position of sample 1 with respect to the sample shield 606. This mechanism will be illustrated in details below in relation with the loading/unloading of the parking stage 602.

FIG. 20 illustrates the situation during transport. Holder 2 with sample 1 is located inside the sample shield 606 and the transfer head 104*b* is in thermal contact with the cooling block 107. In order to load or unload the parking stage 602, the latter is moved along the direction W until the position of the parking recipient 604 from which or to which a sample holder must unloaded respectively loaded is aligned with the axis of the linear transfer rod 104 (cf. FIG. 21).

Now in order to load a sample holder 2 to the parking stage 602, the sample holder 2 is translated with respect to the sample shield 606 in direction of the parking stage 602 by means of the dual shaft linear transfer rod 104. The sample holder 2 is pushed through the opening 606*c* of the sample shield 606 until it reaches the recipient 604 of the parking stage 602 (cf. FIG. 22). The same working principle can be used to transfer a sample holder 2 with sample 1 to a recipient stage of a separate vacuum chamber, for instance an analysis apparatus.

After loading of the parking stage 602, the latter can be pressed again against the stage cooling block 603 in order to keep all the samples 1*a* and holders 2*a* loaded on the parking stage 602 at cryogenic temperature.

Temperature sensors (not shown here) can be provided to measure the temperature of the parking stage 602 and/or the holders 2*a* and/or the samples 1*a*. A heater (not shown here) can be foreseen to regulate the temperature the parking stage 602. Important to note that the components parking stage 602 and sample shield 606 are independent from each other. They can independently be implemented in one of the other embodiments of the present application. For instance, the sample shield 606 can be foreseen in any one of the suitcase 100, 200 or 300.

As illustrated in FIG. 22, the non-evaporable getter element of the pump 103 is positioned right under one opening of the cooling shield 106 and in close proximity to the centre of the chamber 101 in order to reach the highest pumping capacity of the pump 103.

All above-presented embodiments are able to transport samples kept at UHV conditions and at temperatures below 100 K. As already mentioned, applications of such UHV suitcases can be found for instance in surface physics or in semiconductor industry. Another important field of applications in which a cryogenic UHV suitcase according to the present invention can be employed is the field of electron microscopy and in particular the field of transmission electron microscopy (TEM). TEM and high-resolution TEM (HR-TEM) have become the primary tools for structural biology at the single molecule level. For this kind of application, samples have to be prepared in a special manner and kept after preparation all the time at cryogenic temperatures. For example, a drop of solution containing the biomolecule, for instance a protein, from which the three-dimensional structure shall be imaged, is cast onto so-called TEM grids. Before the drop cast on these grids completely dries, the grids are shock frozen by plunging them into a cryogenic fluid, for example liquid nitrogen. Samples must be then either introduced directly into a TEM for imaging or into an analysis/preparation apparatus for further preparation. Such further preparation apparatus can be a focused ion beam (FIB) device. This step is of particular importance in case of imaging of proteins embedded in whole cells. By means of FIB, the cells can precisely be sectioned to reveal their inner structure and the biomolecules to be imaged.

During all the steps mentioned-above, the samples must imperatively be kept at cryogenic temperature. The structure of the objects of interest is otherwise destroyed. Furthermore, the transport of the samples between the location where they were prepared, for example by means of shock freezing, and the location where they are further processed, for instance by FIB, or imaged by means of TEM, shall ideally be made under UHV conditions since it guarantees that the sample is not contaminated by exposure to ambient conditions.

Figure 13:
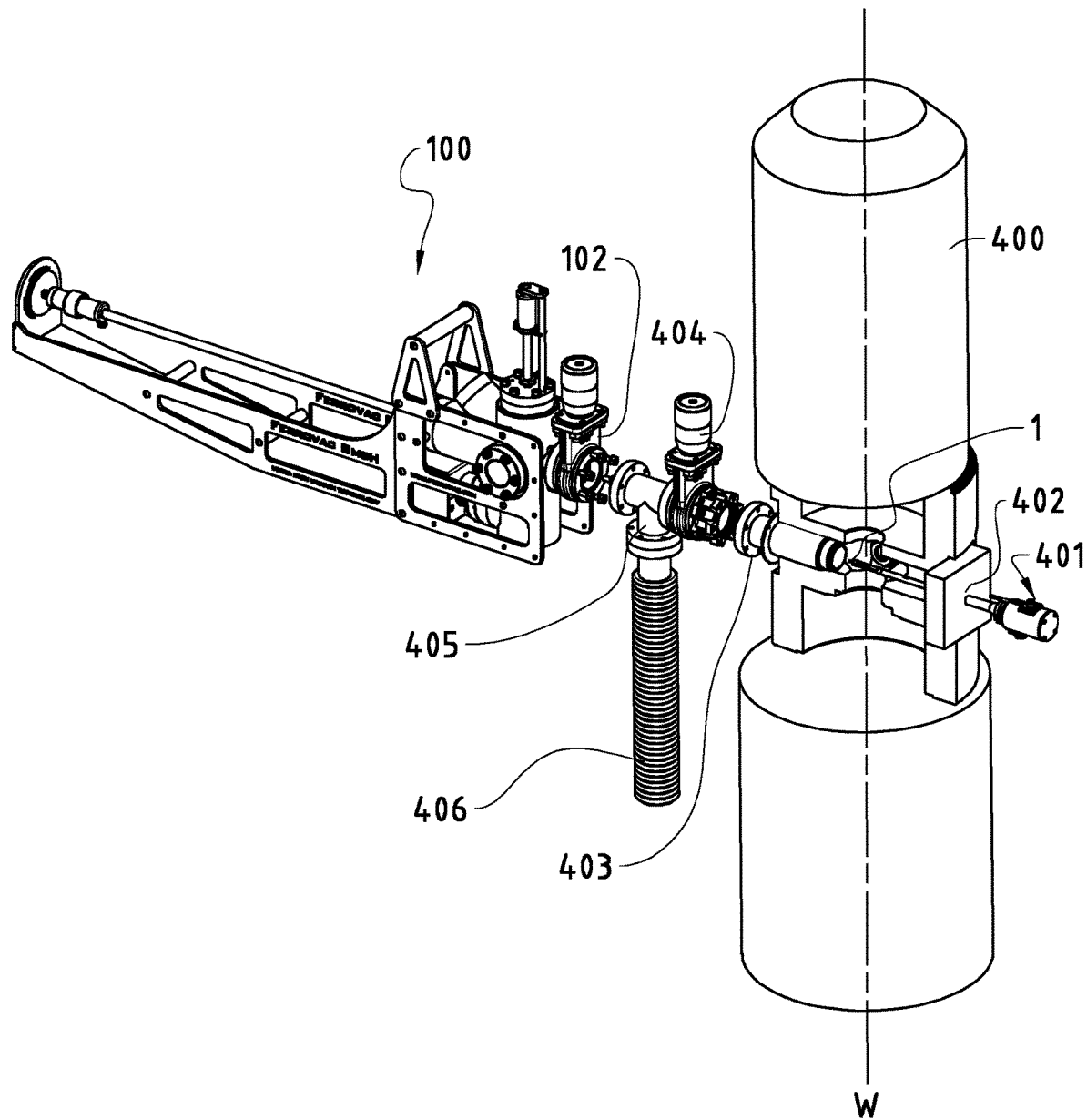
FIG. 13 illustrates how the transfer of a sample to a transmission electron microscope can be achieved by means of a device according to present invention.

FIG. 13 illustrates how a sample 1 kept at UHV conditions and at cryogenic temperatures by means of a cryogenic UHV suitcase can be transferred to a TEM. In this Figure, the TEM is exemplified by a part of its electron column 400 with axis W. A recipient TEM holder 401 is inserted from the regular insertion port 402 that can be found on any commercial TEM. The recipient TEM holder 401 is designed such that a sample 1, when mounted on it, is positioned at the focal point of the electron beam of the TEM electron column 400. For the transfer of sample 1 from a UHV suitcase 100, 200, 300 or 600 to a TEM, a docking port 403 is arranged on the TEM opposite to the regular insertion port 402. As can be seen in FIG. 13, a docking gate valve 404 is attached to the docking port 403 and a buffer volume 405 is provided between the docking gate valve 404 and the gate valve 102 of the UHV suitcase 100. The buffer volume can easily be pumped through the exhaust pipe 406 for instance by means of a turbomolecular pump (not shown here). When the buffer volume 405 has been evacuated, the gate valve 102 of the suitcase 100 and the docking gate valve 404 can be opened and the sample 1 transferred from the suitcase 100 to the TEM.

Figure 14:
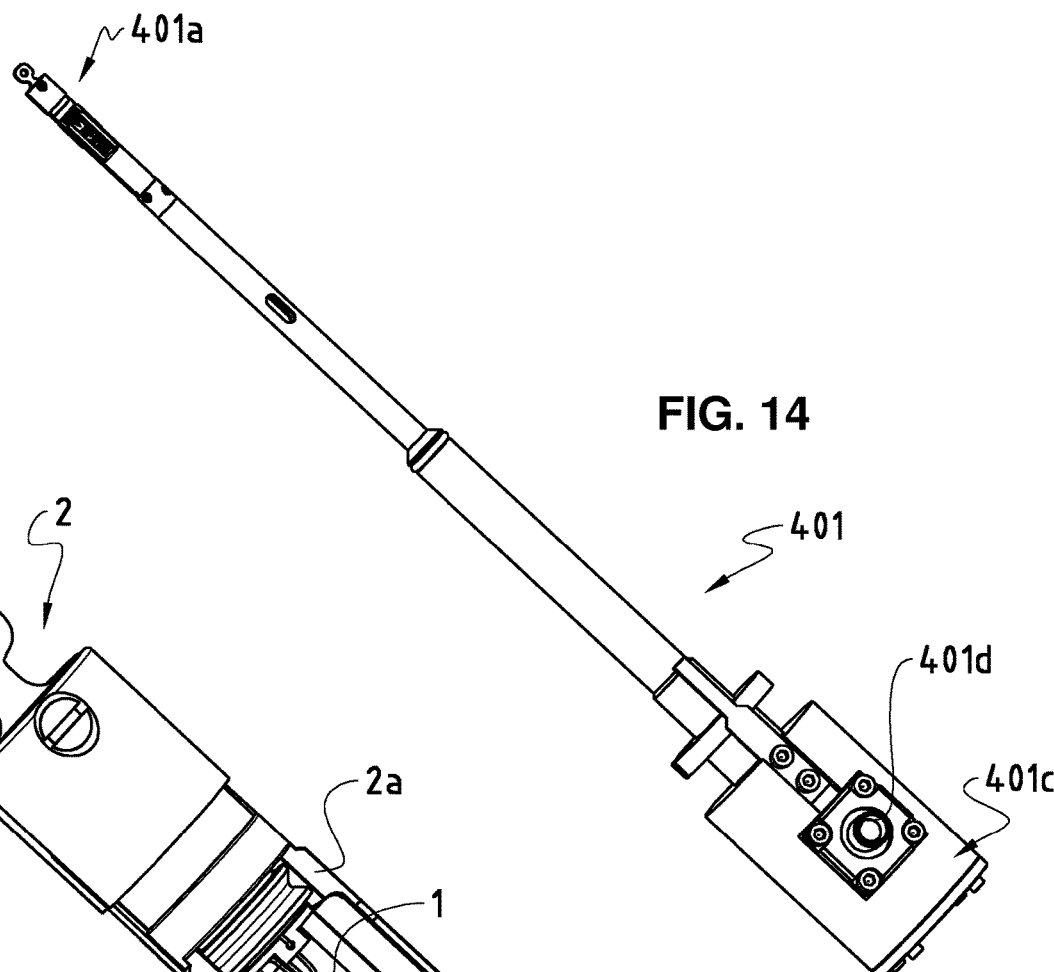
FIG. 14 shows a perspective view of a recipient TEM holder.
Figure 15:
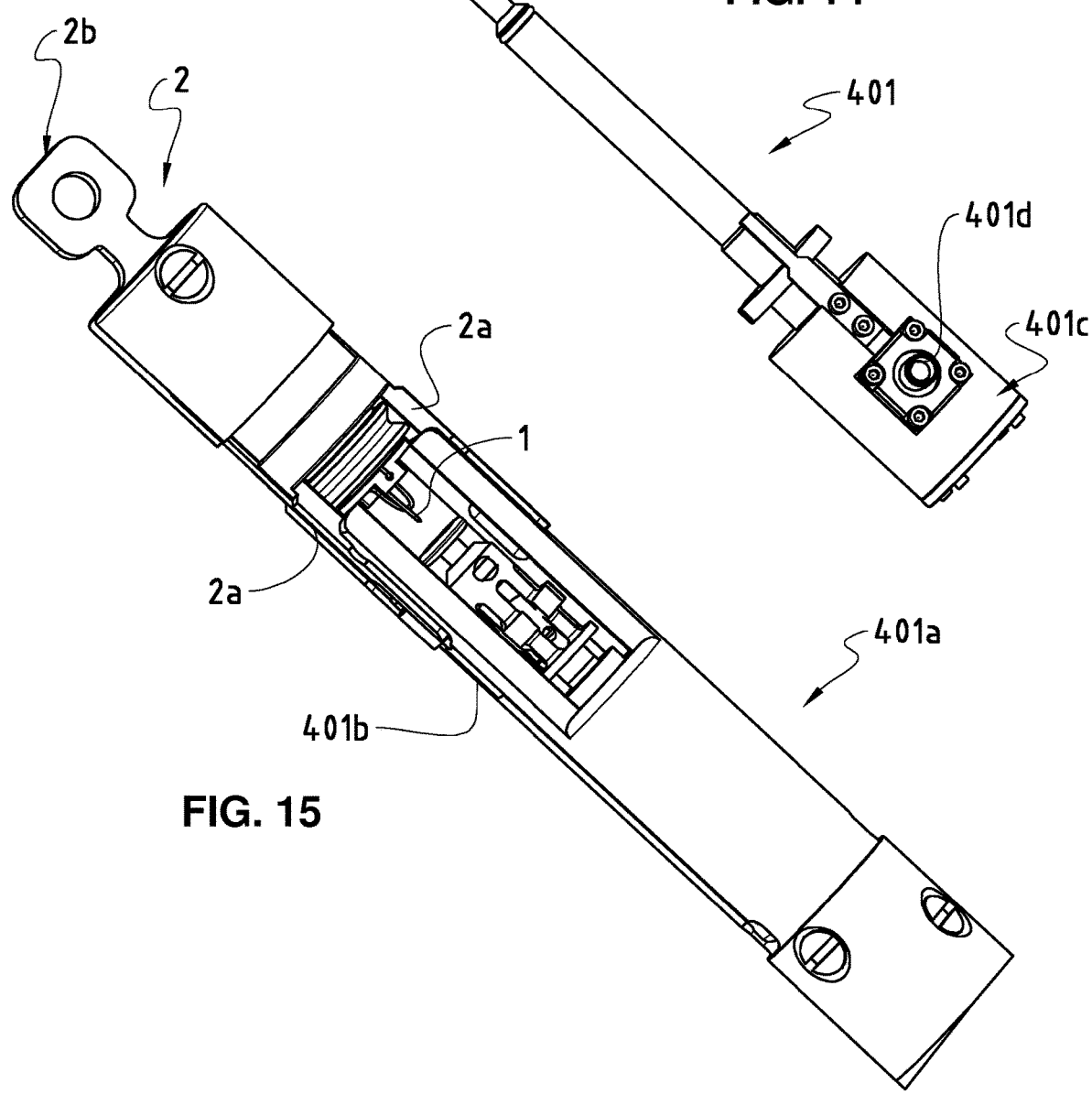
FIG. 15 shows a perspective view of the head of the recipient TEM holder with a sample holder and a sample mounted on it.

The attachment of a sample 1 to the recipient TEM holder 401 shall be illustrated with the help of FIGS. 14 and 15. The recipient TEM holder 401 looks like a regular TEM sample holder. Only the recipient head 401a is slightly modified. As can be best viewed in FIG. 15, the recipient head 401a is designed to receive a sample holder 2 carrying sample 1, which is, in this particular example, an etched metal tip. Of course, sample holder 2 could also be configured to carry a TEM grid with biomolecules of interest. The sample holder 2 possesses legs 2a that can be inserted into the rails 401b of the recipient head 401a. As mentioned above, the dimension of the recipient head 401a and of the sample holder 2 are chosen such that the sample 1 can be positioned at the focal point of the electron beam of the TEM electron column 400. For manipulation, sample holder 2 comprises a manipulation loop 2b that can be grabbed by a gripper 104a of the transfer rod 104 of the suitcase 100 (not shown here). In order to keep sample 1 at cryogenic temperature even after attachment to the recipient head 401b, the recipient TEM holder 410 can be cooled down. For that purpose, the recipient TEM holder comprises a liquid nitrogen reservoir 401c with opening 401d that permits to refill reservoir 401c. Advantageously, the recipient TEM holder is made, at least partially, out of a high thermal conductivity material. This allows for rapidly cooling samples down to 80 K.

Figure 16:
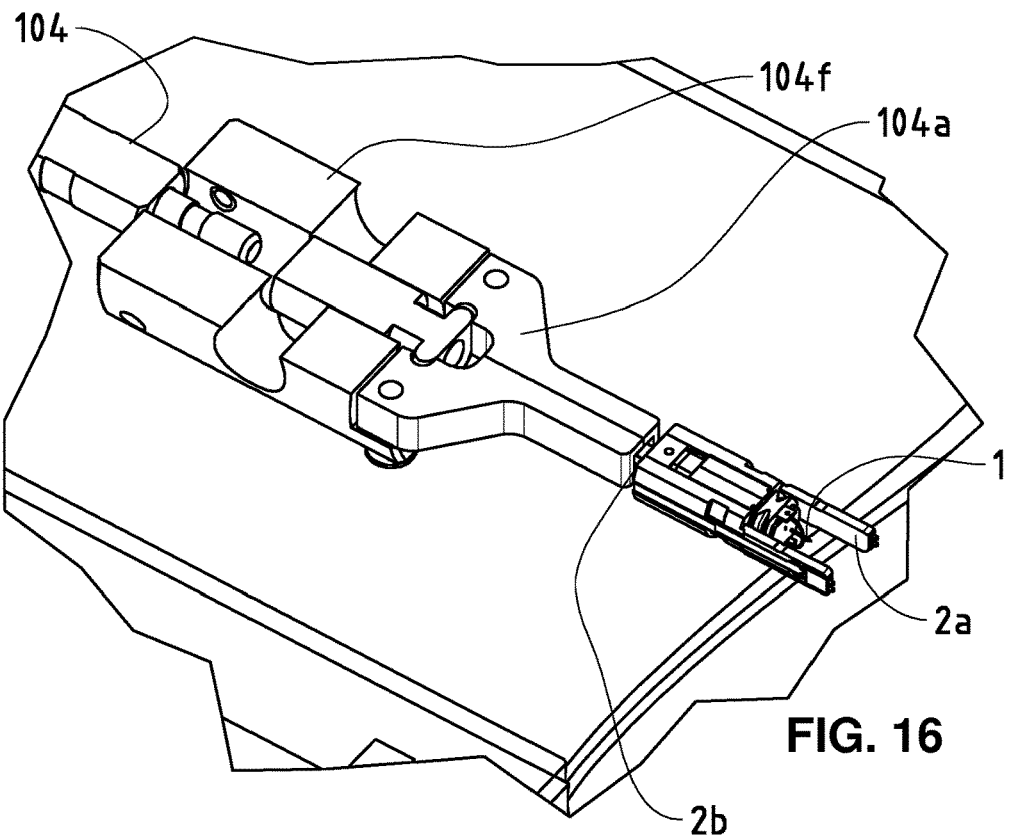
FIG. 16 shows a perspective view of a TEM holder with a sample when they are in the transport device according to the present invention.
Figure 17:
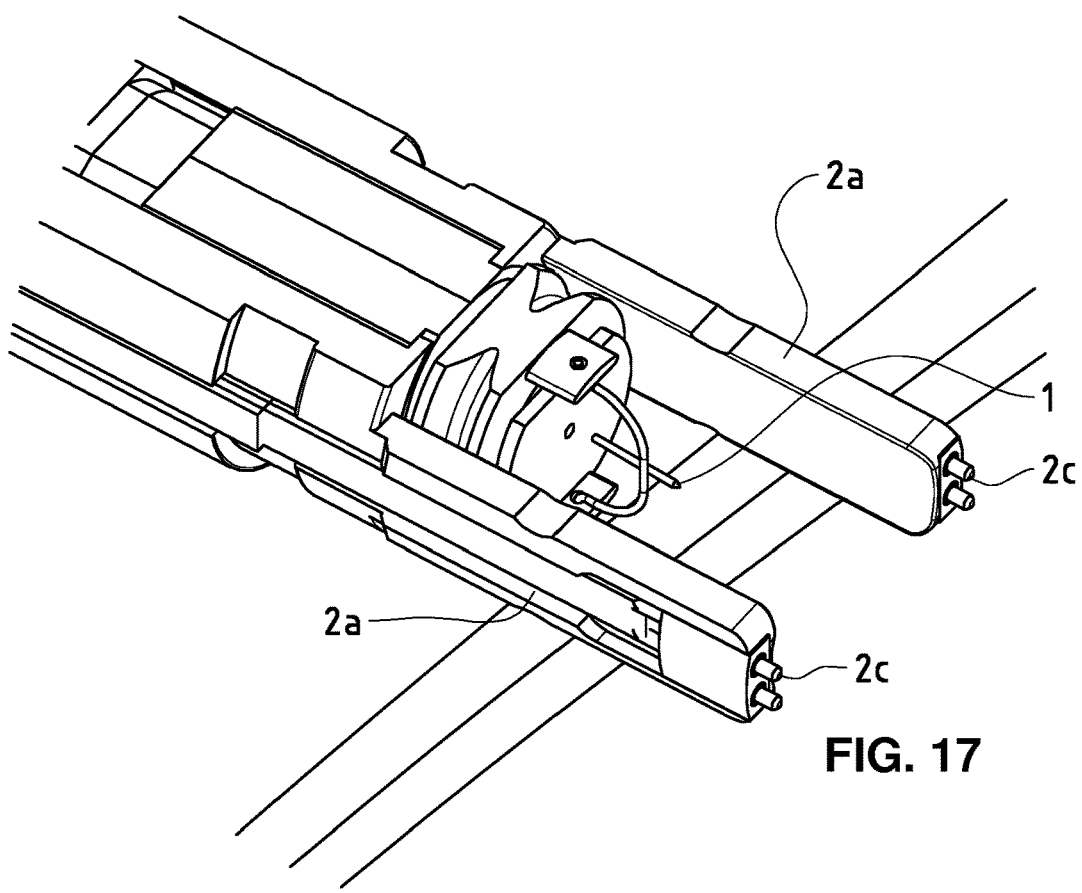
FIG. 17 shows a detailed perspective view of a TEM holder with a sample.

FIG. 16 displays the sample holder 2 with sample 1 in the cryogenic UHV suitcase 100. In this Figure, the gripper 104a is in its closed position and grabs the manipulation loop 2b of holder 2. As illustrated in FIG. 17, the legs 2a of the sample holder 2 comprise pins 2c. These pins 2c insert into corresponding holes in the recipient head 401a upon attachment of the sample holder 2 to the recipient TEM holder 401. The pins 2c can be used to close an electrical circuit and by that to generate a signal notifying that the sample holder 2 is correctly in place on the recipient head 401a.

In order to keep the sample 1 at cryogenic temperatures during transport, one of the above-explained cooing mechanism can be employed. For instance, the gripper body 104f or the sample holder 2 itself can pressed against a cooling block 107 mounted on or attached to the cooling shield 106 (not shown here) of the suitcase 100. A skilled person would not have any difficulty to adapt one of the mechanisms presented above for that purpose. However, it is important to ensure that sample 1 is kept at a temperature slightly above the temperature of the cooling shield 106 in order to guarantee that the sample 1 does not act as cryogenic pump.

One of the most critical aspects when transferring a sample from a transport device to an electron microscope, especially a TEM, is the alignment of the transfer rod axis with the axis of the recipient TEM holder. Only with a perfect alignment of these two axis, a smooth and riskless transfer can be guaranteed. This problem is particularly acute when a sample kept at cryogenic temperature shall be transferred to a recipient stage also kept at low temperature, as it is the case for cryo-electron microscopy. In the frame of this application, two solutions to this problem are proposed. First, the UHV suitcase can comprise a wobble-stick and an alignment device 104d, as presented in conjunction with the description of device 100. Naturally, the devices 200, 300 and 600 could also comprise a wobble-stick as transfer rod. The wobble-stick solution has the major advantage that it offers a high flexibility in the manipulation of the one or more samples transported inside the chamber 101. It is in particular convenient to have a wobble-stick in cases where the transport device comprises a parking stage and where several samples must be handled.

Figure 18:
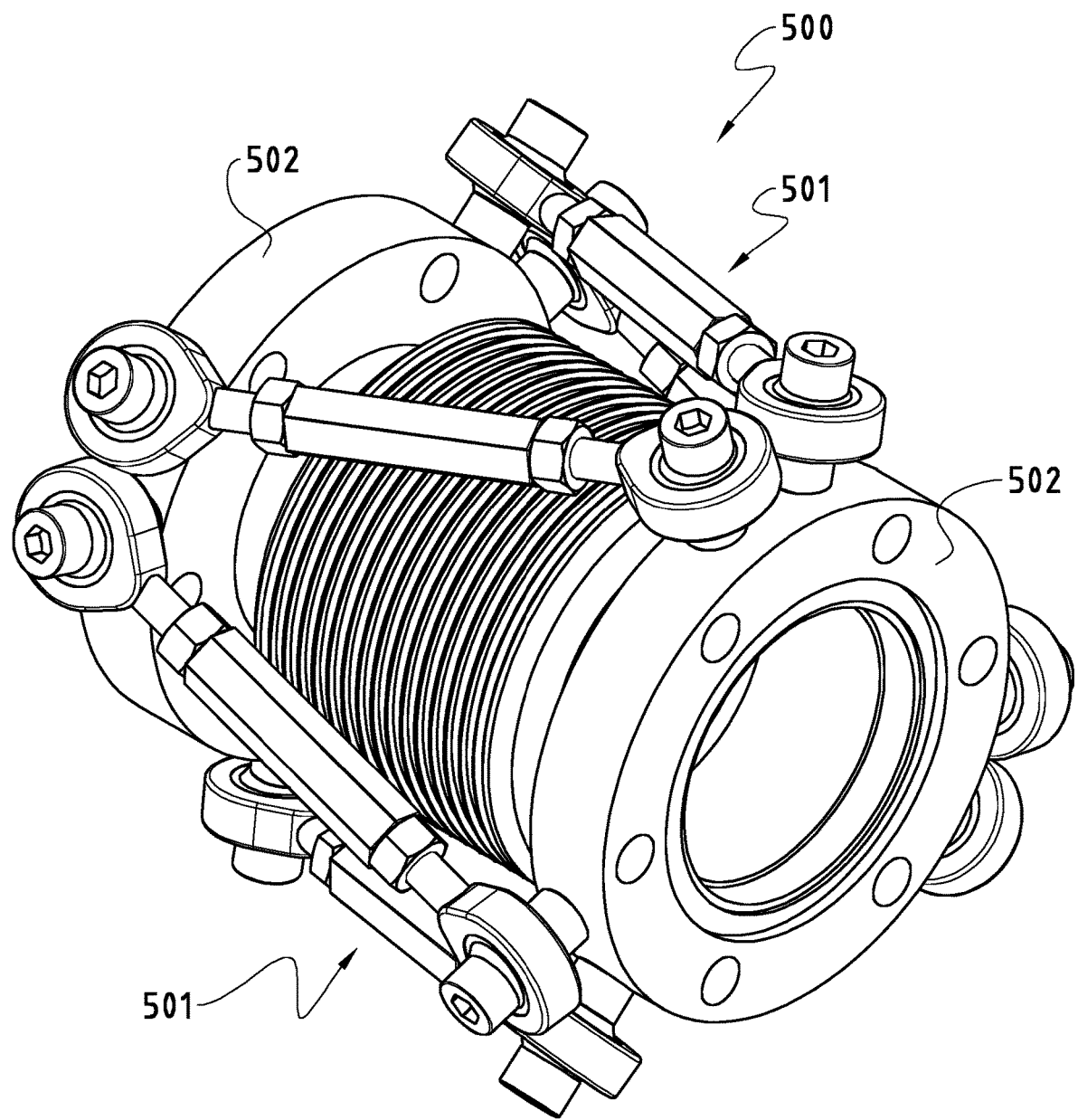
FIG. 18 shows a perspective view of a hexapod port aligner.

A second solution is given by the addition to the transport device 100, 200, 300 or 600 of a hexapod port aligner 500, as shown in FIG. 18. The hexapod port aligner 500 that can be conveniently attached to the valve 102 by means of one of the flanges 502, has six alignment screws 501 instead of the usual three of a common port aligner. The left and right threaded hexnuts allow for angular, linear and lateral (off axis) adjustment. The alignment screws are equipped with pivot mounts on both end and the hexagonal geometry adds additional sturdiness. The major advantage of a hexapod aligner is the precision of alignment in all directions. Moreover, a hexapod aligner 500 allows also for precise alignment even after detachment and re-attachment of the transport device 100, 200, 300 or 600 from, respectively to, the apparatus to which the sample shall be transferred. In such a case, the transport device can have only a linear transfer rod and the transfer could even be automated by using a motorized linear transfer rod.

Important to note is that the hexapod port aligner of FIG. 18 could be modified to act not only as port aligner but also as buffer volume. Such a modified hexapod port aligner could conveniently be used instead of the buffer volume 405 shown in FIG. 13. This would allow for a rapid, easy and fully automated transfer of samples kept at cryogenic temperature to a TEM.

Furthermore, a person skilled in the art will understand that the hexapod port aligner can be used to transfer samples to an electron microscope, in particular a TEM, from any kind of vacuum transfer devices, i.e. not only limited the UHV suitcases of the present invention.

Finally, it should be once again pointed out that the forms of execution described here as examples represent only possibilities for the realization of the inventive ideas and should by no means be regarded as limiting. A person skilled in the art will understand that other implementations of the invention and other elements are possible without neglecting the essential features of the invention.

The invention claimed is:

1. Transportable device for transport and transfer of a sample under ultra-high vacuum conditions and at low temperature, comprising a vacuum chamber, a cooling system, a transfer rod by means of which sample position can be adjusted, a valve by means of which the chamber can be opened or closed and attached to another vacuum apparatus, a pump designed to maintain in the chamber a pressure below $10^{-9}$ mbar all the time a sample is inside the chamber and/or all the time the sample is being transferred, a cooling shield defining a volume inside the chamber in which the sample is kept during transport, wherein the cooling shield is thermally contacted to the cooling system, a sample holder removably attached to the transfer rod and configured to carry the sample during transport, and a cooling block thermally contacted to the cooling shield, wherein the cooling block and the sample holder are configured such that they can be brought in thermal contact inside the volume defined by the cooling shield, wherein the cooling system is configured to be able to cool the cooling shield to a temperature below 80 K, and wherein the thermal contacts between the cooling shield and the cooling block and/or between the cooling block and the sample holder are configured such that the sample is kept at a temperature higher than the cooling shield all the time the temperature of the cooling shield is lower than the temperature of the chamber.

2. Device according to claim 1, wherein the thermal contacts between the cooling shield and the cooling block and/or between the cooling block and the sample holder are configured such that a temperature difference between the cooling shield and the sample is at least 10 K.

3. Device according to claim 1, comprising at least one cooling shield temperature sensor for measuring the temperature of the cooling shield.

4. Device according to claim 1, comprising a sample holder temperature sensor for measuring the temperature of the sample holder.

5. Device according to claim 1, comprising a heater by means of which a temperature difference between the sample and the cooling shield is adjustable.

6. Device according to claim 1, wherein the pump is a non-evaporable getter ion combination pump.

7. Device according to claim 6, comprising a pump controller for supplying high voltage to the pump.

8. Device according to claim 7, wherein the pressure inside the chamber is measurable by means of the pump.

9. Device according to claim 1, wherein the cooling system is a cryogenic fluid Dewar, wherein the cryogenic fluid is liquid nitrogen.

10. Device according to claim 1, further comprising a parking stage linear feedthrough whose air-side portion is positioned inside a Dewar attached to the vacuum chamber, and whose vacuum-side portion is connected to a parking stage, a parking stage cooling block thermally connected to the Dewar and configured such that the parking stage can be cooled down by pressing it against the parking stage cooling block, wherein the parking stage can be translated inside the cooling shield by means of the parking stage linear feedthrough.

11. Device according to claim 1, wherein the cooling system is a mechanical cooler.

12. Device according to claim 11, comprising control electronic means for electrical powering and control of the mechanical cooler.

13. Device according to claim 12, wherein the control electronic means is operatable by means of a battery or by means of a 24 V power source.

14. Device according to claim 1, wherein the cooling shield comprises at least one opening and the chamber has at least one vacuum window, wherein the opening and the vacuum window are arranged such that the sample is optically observable from outside the chamber and while it is kept inside the volume defined by the cooling shield, and further wherein the sample is optically observable while the sample holder and the cooling block are in thermal contact.

15. Device according to claim 14, wherein the at least one opening of the cooling shield is covered by an optically transparent and heat reflective material.

16. Device according to claim 1, further comprising a sample shield located inside the cooling shield and surrounding the sample, wherein the sample shield is displaceable with respect to the cooling shield and wherein the position of the sample with respect to the sample shield can be adjusted for its transfer.

17. Device according to claim 1, comprising a parking stage thermally contacted to the cooling shield on which the sample can be positioned.

18. Device according to claim 17, comprising a parking stage heater by means of which the temperature of the parking stage is adjustable.

19. Device according to claim 1, wherein the transfer rod comprises a transfer head for grabbing and releasing the sample holder, wherein the transfer head is made out of a thermoplastic such as polyether ether ketone or a polyamide imide.

20. Device according to claim 1, configured such that the sample is transferable to an electron microscope.

21. Device according to claim 1, wherein the vacuum chamber is manufactured out of a monolithic block.

22. Device according to claim 1, wherein at least one motion feedthrough, as for instance the transfer rod, the linear feedthrough, or the parking stage linear feedthrough, comprises a slide bearing made out of Sapphire.

* * * * *